(12) United States Patent
Perkins et al.

(10) Patent No.: US 11,431,281 B2
(45) Date of Patent: Aug. 30, 2022

(54) PHOTOVOLTAIC MODULE WITH LIGHT-SCATTERING ENCAPSULANT PROVIDING SHINGLE-MIMICKING APPEARANCE

(71) Applicant: GAF Energy LLC, Parsippany, NJ (US)

(72) Inventors: Richard Perkins, San Jose, CA (US); Alex Sharenko, Berkeley, CA (US); Thierry Nguyen, San Francisco, CA (US); Gabriela Bunea, San Jose, CA (US); Anna Wojtowicz, San Francisco, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 17/186,848

(22) Filed: Feb. 26, 2021

(65) Prior Publication Data
US 2021/0273599 A1 Sep. 2, 2021

Related U.S. Application Data

(60) Provisional application No. 62/982,133, filed on Feb. 27, 2020.

(51) Int. Cl.
*H02S 20/25* (2014.01)
*H01L 31/054* (2014.01)
(Continued)

(52) U.S. Cl.
CPC .............. *H02S 20/25* (2014.12); *B32B 7/12* (2013.01); *B32B 17/10* (2013.01); *E04D 1/28* (2013.01);
(Continued)

(58) Field of Classification Search
CPC .............. H01L 31/048; H01L 31/0481; H01L 31/0547; H02S 20/23; H02S 20/25;
(Continued)

(56) References Cited

U.S. PATENT DOCUMENTS

| 4,636,577 A | 1/1987 | Peterpaul |
| 5,642,596 A | 7/1997 | Waddington |

(Continued)

FOREIGN PATENT DOCUMENTS

| CH | 700095 A2 | 6/2010 |
| EP | 2784241 A1 | 10/2014 |

(Continued)

OTHER PUBLICATIONS

Sunflare, Procducts: "Sunflare Develops Prototype For New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — Mayla Gonzalez Ramos
(74) *Attorney, Agent, or Firm* — Greenberg Traurig, LLP

(57) ABSTRACT

A photovoltaic module having a superstrate layer, an encapsulant having an upper layer and a lower layer, the upper layer being juxtaposed with a lower surface of the superstrate layer, and a photovoltaic layer intermediate the upper layer and the lower layer of the encapsulant. A first portion of the upper layer of the encapsulant includes a first light scattering value as measured in accordance with an ASTM E430 standard, and a second portion of the upper layer of the encapsulant has a second light scattering value as measured in accordance with the ASTM E430 standard. The second light scattering value is greater than the first light scattering value.

20 Claims, 8 Drawing Sheets

(51) Int. Cl.
*H01L 31/048* (2014.01)
*B32B 17/10* (2006.01)
*B32B 7/12* (2006.01)
*E04D 1/30* (2006.01)
*E04D 1/28* (2006.01)

(52) U.S. Cl.
CPC ............ *E04D 1/30* (2013.01); *H01L 31/0481* (2013.01); *H01L 31/0547* (2014.12); *B32B 2307/412* (2013.01); *B32B 2457/12* (2013.01); *E04D 2001/308* (2013.01)

(58) Field of Classification Search
CPC . B32B 2457/12; B32B 2307/412; B32B 7/12; B32B 17/10
See application file for complete search history.

(56) References Cited

U.S. PATENT DOCUMENTS

| | | | |
|---|---|---|---|
| 6,008,450 A | 12/1999 | Ohtsuka et al. | |
| 6,046,399 A * | 4/2000 | Kapner | F24S 25/61 |
| | | | 136/244 |
| 6,341,454 B1 | 1/2002 | Koleoglou | |
| 6,928,781 B2 | 8/2005 | Desbois et al. | |
| 7,155,870 B2 | 1/2007 | Almy | |
| 7,487,771 B1 | 2/2009 | Eiffert et al. | |
| 7,587,864 B2 | 9/2009 | McCaskill et al. | |
| 7,678,990 B2 | 3/2010 | McCaskill et al. | |
| 7,678,991 B2 | 3/2010 | McCaskill et al. | |
| 7,748,191 B2 | 7/2010 | Podirsky | |
| 7,819,114 B2 | 10/2010 | Augenbraun et al. | |
| 7,824,191 B1 | 11/2010 | Browder | |
| 7,832,176 B2 | 11/2010 | McCaskill et al. | |
| 8,210,570 B1 | 7/2012 | Railkar et al. | |
| 8,371,076 B2 | 2/2013 | Jones et al. | |
| 8,468,754 B2 | 6/2013 | Railkar et al. | |
| 8,505,249 B2 | 8/2013 | Geary | |
| 8,512,866 B2 | 8/2013 | Taylor | |
| 8,713,858 B1 * | 5/2014 | Xie | F24S 25/613 |
| | | | 52/58 |
| 8,713,860 B2 | 5/2014 | Railkar et al. | |
| 8,925,262 B2 | 1/2015 | Railkar et al. | |
| 8,946,544 B2 | 2/2015 | Jacobs et al. | |
| 8,994,224 B2 | 3/2015 | Mehta et al. | |
| 9,169,646 B2 | 10/2015 | Rodrigues et al. | |
| 9,273,885 B2 | 3/2016 | Rodrigues et al. | |
| 9,359,014 B1 | 6/2016 | Yang et al. | |
| 9,605,432 B1 | 3/2017 | Robbins | |
| 9,711,672 B2 | 7/2017 | Wang | |
| 9,711,991 B2 | 7/2017 | Hall et al. | |
| 9,831,818 B2 | 11/2017 | West | |
| 9,912,284 B2 | 3/2018 | Svec | |
| 9,923,515 B2 | 3/2018 | Rodrigues et al. | |
| 9,991,412 B2 | 6/2018 | Gonzalez et al. | |
| 10,027,273 B2 | 7/2018 | West et al. | |
| 10,115,850 B2 | 10/2018 | Rodrigues et al. | |
| 10,187,005 B2 | 1/2019 | Rodrigues et al. | |
| 10,256,765 B2 | 4/2019 | Rodrigues et al. | |
| D879,031 S | 3/2020 | Lance et al. | |
| D904,289 S | 12/2020 | Lance et al. | |
| 2003/0217768 A1 | 11/2003 | Guha | |
| 2006/0042683 A1 | 3/2006 | Gangemi | |
| 2007/0181174 A1 | 8/2007 | Ressler | |
| 2008/0035140 A1 | 2/2008 | Placer et al. | |
| 2008/0315061 A1 | 2/2008 | Placer et al. | |
| 2009/0019795 A1 | 1/2009 | Szacsvay et al. | |
| 2009/0044850 A1 | 2/2009 | Kimberley | |
| 2009/0114261 A1 | 5/2009 | Stancel et al. | |
| 2009/0159118 A1 | 6/2009 | Kalkanoglu et al. | |
| 2010/0101634 A1 | 4/2010 | Frank et al. | |
| 2010/0139184 A1 * | 6/2010 | Williams | E04D 11/002 |
| | | | 52/173.3 |
| 2011/0030761 A1 | 2/2011 | Kalkanoglu et al. | |
| 2011/0036386 A1 | 2/2011 | Browder | |
| 2011/0048507 A1 | 3/2011 | Livsey et al. | |
| 2011/0058337 A1 | 3/2011 | Han et al. | |
| 2011/0132427 A1 | 6/2011 | Kalkanoglu et al. | |
| 2011/0239555 A1 | 10/2011 | Cook et al. | |
| 2011/0302859 A1 | 12/2011 | Crasnianski | |
| 2012/0060902 A1 | 3/2012 | Drake | |
| 2012/0176077 A1 | 7/2012 | Oh et al. | |
| 2012/0212065 A1 | 8/2012 | Cheng et al. | |
| 2012/0233940 A1 | 9/2012 | Perkins et al. | |
| 2012/0240490 A1 | 9/2012 | Gangemi | |
| 2012/0260977 A1 | 10/2012 | Stancel | |
| 2013/0014455 A1 | 1/2013 | Grieco | |
| 2013/0306137 A1 * | 11/2013 | Ko | C08L 83/04 |
| | | | 136/246 |
| 2014/0366464 A1 * | 12/2014 | Rodrigues | H02S 40/36 |
| | | | 52/173.3 |
| 2016/0359451 A1 | 12/2016 | Mao et al. | |
| 2017/0159292 A1 | 6/2017 | Chihlas et al. | |
| 2018/0094438 A1 | 4/2018 | Wu et al. | |
| 2018/0351502 A1 | 12/2018 | Almy et al. | |
| 2019/0305717 A1 * | 10/2019 | Allen | H02S 20/24 |
| 2020/0020819 A1 | 1/2020 | Farhangi | |
| 2020/0109320 A1 * | 4/2020 | Jiang | B32B 25/08 |
| 2020/0144958 A1 | 5/2020 | Rodrigues et al. | |
| 2021/0044250 A1 | 2/2021 | Liu et al. | |
| 2021/0159353 A1 * | 5/2021 | Li | H01L 31/048 |

FOREIGN PATENT DOCUMENTS

| | | | |
|---|---|---|---|
| JP | 2001-098703 A | 4/2001 | |
| WO | 2011/049944 A1 | 4/2011 | |
| WO | 2015/133632 A1 | 9/2015 | |
| WO | WO-2019201416 A1 * | 10/2019 | ........... H01L 31/186 |

OTHER PUBLICATIONS

RGS Energy, 3.5kW POWERHOUSE 3.0 system installed in an afternoon; Jun. 7, 2019 <<facebook.com/RGSEnergy/>> retrieved Feb. 2, 2021.

Tesla, Solar Roof <<tesla.com/solarroof>> retrieved Feb. 2, 2021.

* cited by examiner

PHOTOVOLTAIC MODULE WITH LIGHT-SCATTERING ENCAPSULANT PROVIDING SHINGLE-MIMICKING APPEARANCE

CROSS-REFERENCE TO RELATED APPLICATION

This application is a Section 111(a) application relating to and claiming the benefit of commonly-owned U.S. Provisional Patent Application Ser. No. 62/982,133, filed Feb. 27, 2020, entitled "PHOTOVOLTAIC MODULE WITH LIGHT-SCATTERING ENCAPSULANT PROVIDING SHINGLE-MIMICKING APPEARANCE," the contents of which is incorporated herein by reference in its entirety.

FIELD OF THE INVENTION

The present invention relates to roof-integrated photovoltaic modules. More particularly, the present invention relates to roof-integrated photovoltaic modules with light-scattering encapsulants providing a non-uniform or randomized appearance, and roofing systems including such modules.

BACKGROUND

Photovoltaic modules can be placed on building roofs (e.g., residential roofs) to generate electricity. One obstacle to mass-market adoption of solar roofing is poor aesthetics. Standard rack-mounted photovoltaic ("PV") systems have a very different appearance than traditional roofing materials (e.g., asphalt shingles, wooden shingles, slate shingles, etc.), which can draw unwanted attention. Even low-profile PV systems still receive poor aesthetic feedback from consumers.

SUMMARY

In an embodiment, a system including at least one photovoltaic module installed on a roof deck, wherein each of the at least one photovoltaic module includes a superstrate layer having an upper surface and a lower surface opposite the upper surface, an encapsulant having an upper layer and a lower layer opposite the upper layer, wherein the upper layer is juxtaposed with the lower surface of the superstrate layer; and a photovoltaic layer intermediate the upper layer and the lower layer of the encapsulant, wherein a first portion of the upper layer of the encapsulant has a first light scattering value as measured in accordance with an ASTM E430 standard, wherein a second portion of the upper layer of the encapsulant has a second light scattering value as measured in accordance with the ASTM E430 standard, and wherein the second light scattering value is greater than the first light scattering value.

In an embodiment, the first light scattering value is 0.1 HU to 12 HU. In an embodiment, the second light scattering value is 0.1 HU to 12 HU. In an embodiment, the upper layer of the encapsulant includes a polymeric material. In an embodiment, the polymeric material includes at least one of ethylene-co-vinyl acetate, polydimethyl siloxane, a polyolefin elastomer, or a combination thereof. In an embodiment, the superstrate layer includes a glass material. In an embodiment, the superstrate layer includes a polymeric material. In an embodiment, the superstrate layer is optically transparent. In an embodiment, the second portion includes a pattern. In an embodiment, the pattern includes at least one of squares, rectangles, lozenges, diamonds, rhombuses, parallelograms, circles, hexagons, triangles, or a combination thereof.

In an embodiment, a transmission loss of power of light transmitted through the upper layer of the encapsulant having the first and second portions is less than 2 percent as compared to light transmitted through a comparison upper encapsulant layer that is identical to the upper layer of the encapsulant but lacks the second portion. In an embodiment, the at least one photovoltaic module includes a first photovoltaic module and a second photovoltaic module, wherein the second photovoltaic module is adjacent to the first photovoltaic module, and wherein a shape of the second portion of the upper layer of the encapsulant of the first photovoltaic module is different from a shape of the second portion of the upper layer of the encapsulant of the second photovoltaic module. In an embodiment, the difference between the shape of the second portion of the upper layer of the encapsulant of the first photovoltaic module and the shape of the second portion of the upper layer of the encapsulant of the second photovoltaic module imparts a random appearance to the system.

In an embodiment, the at least one photovoltaic module includes an upper portion and a lower portion, wherein the at least one photovoltaic module is configured to be installed such that the upper portion is at a higher elevation than the lower portion, and wherein the system further includes at least one starter bar configured to be installed to a roof deck, wherein the at least one starter bar includes a foot base; a plurality of water shedding layers, a first one of which is configured to be installed over the foot base of the at least one starter bar, and at least one of another of which is configured to overlap and be installed over the first one of the plurality of water shedding layers; and a foot module configured to be attached to the upper portion of the at least one photovoltaic module, wherein the lower portion of the at least one first photovoltaic module is adapted to align with the foot base of the at least one starter bar, and the foot module is configured to be affixed to a last overlapping layer of the at least one of another of the first plurality of water shedding layers to the roof deck.

In an embodiment, a photovoltaic module includes at least one solar cell; an encapsulant encapsulating the at least one solar cell; and a frontsheet juxtaposed with the encapsulant, wherein the frontsheet includes a glass layer having a first surface, a light scattering encapsulant layer having a first surface and a second surface opposite the first surface of the light scattering encapsulant layer, wherein the second surface of the light scattering encapsulant layer is attached to the first surface of the glass layer, and a polymer layer having a first surface and a second surface opposite the first surface of the polymer layer, wherein the second surface of the polymer layer is attached to the first surface of the light scattering encapsulant layer, wherein a first portion of the light scattering encapsulant layer has a first light scattering value as measured in accordance with an ASTM E430 standard, wherein a second portion of the light scattering encapsulant layer has a second light scattering value as measured in accordance with the ASTM E430 standard, and wherein the second light scattering value is greater than the first light scattering value.

In an embodiment, the first light scattering value is 0.1 HU to 12 HU. In an embodiment, the second light scattering value is 0.1 HU to 12 HU. In an embodiment, the polymer layer is attached to the light scattering layer by an adhesive layer. In an embodiment, the adhesive layer is selected from the group consisting of thermosetting polyolefin, thermosetting polyolefin encapsulant material, thermosetting ethylene-vinyl acetate (EVA), EVA encapsulants, thermoplastic olefin, thermoplastic polyolefin (TPO) and hybrids and combinations thereof. In an embodiment, the adhesive layer includes a thermosetting polyolefin encapsulant material. In an embodiment, the polymer layer includes a fluoropolymer. In an embodiment, the polymer layer includes a material selected from the group consisting of acrylics, polyesters, silicones, and polycarbonates. In an embodiment, the light scattering encapsulant layer includes a polymeric material. In an embodiment, the polymeric material includes at least one of ethylene-co-vinyl acetate, polydimethyl siloxane, a polyolefin elastomer, or a combination thereof.

In an embodiment, the second portion includes a pattern. In an embodiment, the pattern includes at least one of squares, rectangles, lozenges, diamonds, rhombuses, parallelograms, circles, hexagons, triangles, or a combination thereof.

In an embodiment, a system includes a plurality of photovoltaic modules installed on a roof deck, wherein each of the photovoltaic modules includes a superstrate layer having an upper surface and a lower surface opposite the upper surface, and an encapsulant having an upper layer and a lower layer opposite the upper layer, wherein the upper layer is juxtaposed with the lower surface of the superstrate layer, and wherein a first portion of the upper layer of the encapsulant has a first light scattering value as measured in accordance with an ASTM E430 standard, wherein a second portion of the upper layer of the encapsulant has a second light scattering value as measured in accordance with the ASTM E430 standard, and wherein the second light scattering value is greater than the first light scattering value.

In an embodiment, each of the plurality of photovoltaic modules includes a photovoltaic layer intermediate the upper layer of the encapsulant and the lower layer of the encapsulant, wherein at least a first one of the photovoltaic modules is electrically active, and wherein at least a second one of the photovoltaic modules is electrically inactive. In an embodiment, the second one of the photovoltaic modules meets standards of California Building Energy Efficiency Standards of Residential and Nonresidential Buildings, Title 24, Part 6. In an embodiment, the second one of the photovoltaic modules has a solar reflectivity index (SRI) greater than 16.

DETAILED DESCRIPTION

Figure 1:
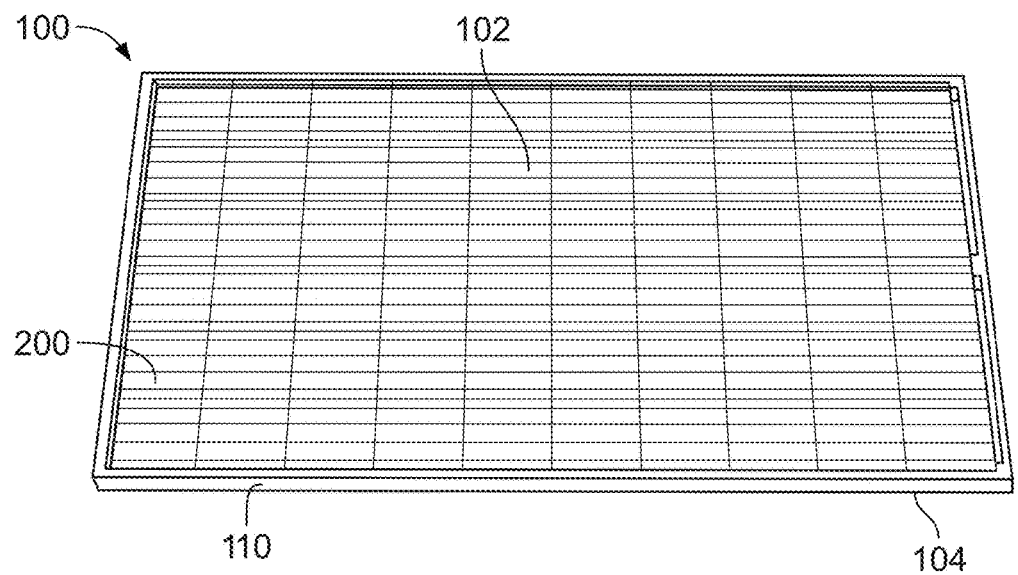
FIG. 1 shows a perspective view of an exemplary PV module.

The present invention will be further explained with reference to the attached drawings, wherein like structures are referred to by like numerals throughout the several views. The drawings shown are not necessarily to scale, with emphasis instead generally being placed upon illustrating the principles of the present invention. Further, some features may be exaggerated to show details of particular components.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

Throughout the specification and claims, the following terms take the meanings explicitly associated herein, unless the context clearly dictates otherwise. The phrases "in one embodiment" and "in some embodiments" as used herein do not necessarily refer to the same embodiment(s), though they may. Furthermore, the phrases "in another embodiment" and "in some other embodiments" as used herein do not necessarily refer to a different embodiment, although they may. Thus, as described below, various embodiments of the invention may be readily combined, without departing from the scope or spirit of the invention.

The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

The exemplary embodiments relate to layered photovoltaic ("PV") modules that include a light-scattering upper encapsulant layer (i.e., layer that is positioned between the PV elements and the sun when the PV module is installed on a roof deck) to impart an appearance more closely resembling that of a traditional (e.g., shingled) roof. In some embodiments, an exemplary PV module having a light-scattering upper encapsulant layer is an element of a PV system including multiple PV modules, in which adjacent PV modules have light-scattering upper encapsulant layers that are patterned differently from one another, thereby imparting a random-seeming appearance to the PV system.

FIG. 1 shows a PV module 100. In some embodiments, the PV module 100 has an upper surface 102 (i.e., the surface that, when the PV module 100 is installed on a roof deck, faces away from the roof and toward the sun) and a lower surface 104 opposite the upper surface 102. In some embodiments, the PV module 100 includes a layered structure 200 having an upper surface 202 and a lower surface 204 opposite the upper surface 202. In some embodiments, the upper surface 202 of the layered structure forms the upper surface 102 of the PV module 100. In some embodiments, the lower surface 204 of the layered structure 200 forms the lower surface 104 of the PV module 100. In some embodiments, the PV module 100 includes one or more other elements (e.g., a spacer, an underlayment, etc.) underlaying the layered structure 200, and the lower surface 204 of the layered structure 200 does not form the lower surface 104 of the PV module 100. In some embodiments, the PV module 100 includes a frame 110 surrounding the layered structure 200. In some embodiments, the frame 110 includes a polymer. In some embodiments, the frame 110 includes a metal, such as aluminum or steel. In some embodiments, the PV module 100 includes one or more electrical connections (e.g., junction boxes) configured to electrically interconnect one of the PV module 100 with others of the PV module 100, with the electrical system of a structure to which the PV module is installed, etc.

Figure 2A:
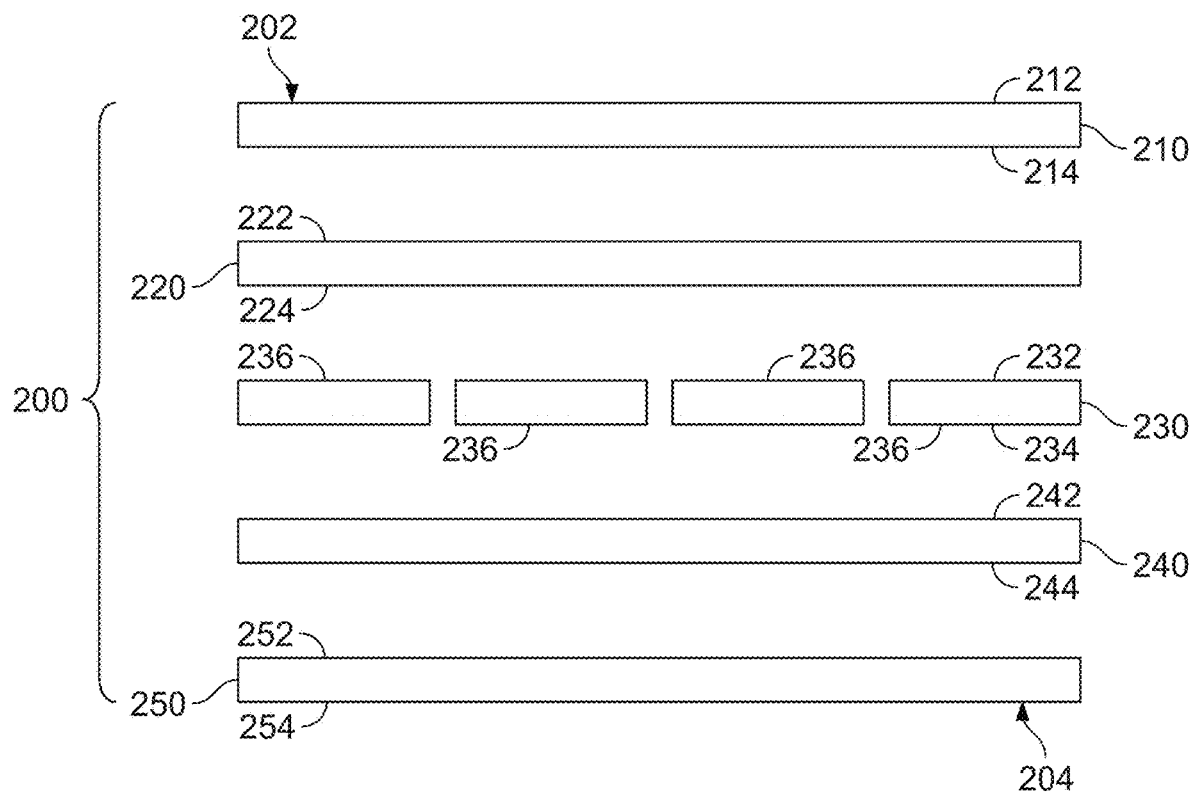
FIG. 2A shows a schematic view of elements of a layered structure of an exemplary PV module before lamination.
Figure 2B:
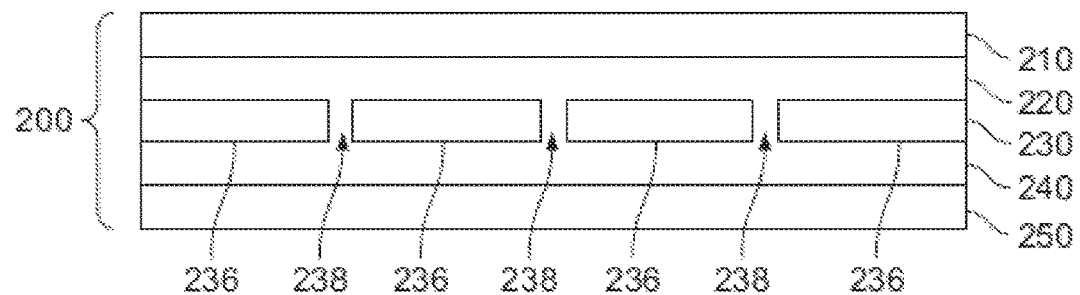
FIG. 2B shows a schematic view of a layered structure of an exemplary PV module formed by lamination of the elements shown in FIG. 2A.

FIGS. 2A and 2B show an exemplary embodiment of a layered structure 200 that, in some embodiments, forms part of the PV module 100. FIG. 2A shows an exploded view of the layers of the layered structure 200 prior to lamination to form the layered structure 200. FIG. 2B shows the layered structure following lamination. It will be apparent to those of skill in the art that FIGS. 2A and 2B present schematic views of the layered structure 200 and are not intended to provide a to-scale representation.

Referring now to FIG. 2A, in some embodiments, the layered structure 200 includes a superstrate layer 210 that forms the upper surface 202 of the layered structure 200 and the upper surface 102 of the PV module 100 (i.e., the surface that, when the PV module 100 is installed on a roof deck, faces away from the roof and toward the sun). In some embodiments, the superstrate layer 210 has an upper surface 212 (i.e., the side of the superstrate layer 210 that faces toward the sun when installed as described above) and a lower surface 214 opposite the upper surface 212. In some embodiments, the superstrate layer 210 is optically transparent (e.g., it has a solar weighted transmittance of 80% or greater). In some embodiments, the superstrate layer 210 provides electrical insulation and moisture resistance. In some embodiments, the superstrate layer 210 comprises a glass material, such as low-iron solar glass. In some embodiments, the superstrate layer 210 comprises a polymeric material such as ethylene tetrafluoroethylene ("ETFE"), polyethylene terephthalate ("PET"), or an acrylic such as polymethyl methacrylate ("PMMA"). In some embodiments, the superstrate layer 210 has a thickness of 50 microns to 250 microns. In some embodiments, the superstrate layer 210 has a thickness of 50 microns to 200 microns. In some embodiments, the superstrate layer 210 has a thickness of 50 microns to 150 microns. In some embodiments, the superstrate layer 210 has a thickness of 50 microns to 100 microns. In some embodiments, the superstrate layer 210 has a thickness of 100 microns to 250 microns. In some embodiments, the superstrate layer 210 has a thickness of 100 microns to 200 microns. In some embodiments, the superstrate layer 210 has a thickness of 100 microns to 150 microns. In some embodiments, the superstrate layer 210 has a thickness of 150 microns to 250 microns. In some embodiments, the superstrate layer 210 has a thickness of 150 microns to 200 microns. In some embodiments, the superstrate layer 210 has a thickness of 200 microns to 250 microns.

Continuing to refer to FIG. 2A, in some embodiments, the layered structure 200 includes an upper encapsulant layer 220. In some embodiments, the upper encapsulant layer 220 has an upper surface 222 and a lower surface 224 opposite the upper surface 222. In some embodiments, the upper surface 222 of the upper encapsulant layer 220 contacts the lower surface 214 of the superstrate layer 210. In some embodiments, the upper encapsulant layer 220 is optically transparent (e.g., it has a solar weighted transmittance of 80% or greater). In some embodiments, the upper encapsulant layer provides electrical insulation. In some embodiments, the upper encapsulant layer 220 comprises an encapsulating material such as ethylene-co-vinyl acetate ("EVA"), polydimethyl siloxane ("PDMS"), a polyolefin elastomer ("POE"), polyvinyl butyral ("PVB"), polyurethane epoxy, silicone, or an ionomer such as the series of ionomer-based encapsulants commercialized by DuPont de Nemours, Inc. under the trade name PV5400. In some embodiments, the thickness of the upper encapsulant layer 220 varies across the layered structure 200, as will be discussed in greater detail hereinafter.

Continuing to refer to FIG. 2A, in some embodiments, the layered structure 200 includes a PV layer 230 having an upper surface 232 and a lower surface 234 opposite the upper surface 232. In some embodiments, the upper surface 232 of the PV layer 230 contacts the lower surface 224 of the upper encapsulant layer 220. In some embodiments, the PV layer 230 includes at least one PV element 236. In some embodiments, the PV layer 230 includes an array of the PV elements 236. In some embodiments in which the PV layer 230 includes a plurality of the PV elements 236, the PV elements 236 are electrically interconnected with one another. In some embodiments, the PV layer 230 includes an array of interconnected PV elements 236. In some embodiments, gaps are formed between adjacent ones of the PV elements 236. In some embodiments, a width of the gaps are significantly smaller than a width of each of the PV elements 236. For example, in some embodiments, a width of each of the PV elements 236 is 160 millimeters and the gaps is 2 millimeters to 5 millimeters in size. In some embodiments, the PV layer 230 also includes other active and/or passive electronic components.

Continuing to refer to FIG. 2A, in some embodiments, the layered structure 200 includes a lower encapsulant layer 240 having an upper surface 242 and a lower surface 244 opposite the upper surface 242. In some embodiments, the upper surface 242 of the lower encapsulant layer 240 contacts the lower surface 234 of the PV layer 230. In some embodiments, the lower encapsulant layer 240 provides electrical insulation. In some embodiments, the lower encapsulant layer 240 is optically transparent. In some embodiments, the lower encapsulant layer 240 is not optically transparent. In some embodiments, the thickness of the lower encapsulant layer 240 is 100 microns to 1000 microns. In some embodiments, the thickness of the lower encapsulant layer 240 is sufficiently large (e.g., greater than 100 microns) so as to prevent delamination between the PV layer 230 and a substrate 250. In some embodiments, the thickness of the lower encapsulant layer 240 is consistent across the entirety of the layered structure 200. In some embodiments, the lower encapsulant layer 240 comprises an encapsulating material such as ethylene-co-vinyl acetate ("EVA"), polydimethyl siloxane ("PDMS"), a polyolefin elastomer ("POE"), polyvinyl butyral ("PVB"), polyurethane epoxy, silicone, or an ionomer such as the series of ionomer-based encapsulants commercialized by DuPont de Nemours, Inc. under the trade name PV5400. In some embodiments, the lower encapsulant layer 240 comprises the same encapsulating material as the upper encapsulant layer 220.

Continuing to refer to FIG. 2A, in some embodiments, the layered structure 200 includes a substrate 250 having an upper surface 252 and a lower surface 254 opposite the lower surface 252. In some embodiments, the upper surface 252 of the substrate 250 contacts the lower surface 244 of the lower encapsulant layer 240. In some embodiments, the lower surface 254 of the substrate 250 forms the lower surface 204 of the layered structure 200. In some embodiments, the substrate 250 provides electrical insulation and moisture resistance. In some embodiments, the substrate 250 is optically transparent. In some embodiments, the substrate 250 is not optically transparent. In some embodiments, the substrate 250 comprises a glass material. In some embodiments, the substrate 250 comprises a polymeric material such as ETFE, PET, an acrylic such as PMMA, polypropylene, polyvinyl chloride ("PVC"), or a glass-reinforced or fiber-reinforced composite such as a material meeting the National Electrical Manufacturers Association ("NEMA") grades FR-4 or G-10. In some embodiments, the substrate 250 has a thickness of 200 microns to ¼ inch. In some embodiments, the substrate 250 is sufficiently rigid to provide mechanical stiffening to the PV module 100. In an embodiment, the substrate 250 is unpainted.

Referring now to FIG. 2B, the layered structure 200 is shown following lamination. In some embodiments, during the lamination process, the encapsulating material of the upper encapsulant layer 220 and the encapsulating material of the lower encapsulant layer 240 are melted and flow within the gaps between adjacent ones of the PV elements 236 shown in FIG. 2A, thereby encapsulating (e.g., surrounding on all sides) each of the PV elements 236 with encapsulating material. In some embodiments, as a result of this process, the PV layer 230 includes encapsulant portions 238 located between adjacent ones of the PV elements 236, and providing continuity between the encapsulating material of the upper encapsulant layer 220 and the encapsulating material of the lower encapsulant layer 240. In some embodiments, the resulting region of the layered structure 200 (e.g., the upper encapsulant layer 220, the PV layer 230, and the lower encapsulant layer 240) resembles a single block of encapsulant material with the PV elements positioned therein. In some embodiments, none of the layers of the layered structure 200 is painted. In some embodiments, the superstrate layer 210 and the substrate 250 are unpainted.

In some embodiments, the upper encapsulant layer 220 includes at least two portions having different light scattering properties from one another. In some embodiments, a light scattering value of each such portion can be quantified in accordance with the ASTM D1003 Standard Test Method for Haze and Luminous Transmittance of Transparent Plastics. In some embodiments, a light scattering value of each such portion can be quantified in accordance with the ASTM E430 Standard Test Methods for Measurement of Gloss of High-Gloss Surfaces by Abridged Goniophotometry. In some embodiments, a light scattering value of each such portion can be quantified in accordance with ISO 13803 standard—Paints and Varnishes—Determination of Haze on Paint Films at 20°. In an embodiment, the light scattering value of a first portion of the upper encapsulant layer 220 is greater than the light scattering value of a second portion of the upper encapsulant layer 220. In an embodiment, the light scattering value of the first portion and the light scattering value of the second portion of the upper encapsulant layer 220 are measured in haze units (HU).

In an embodiment, the light scattering value of the first portion of the upper encapsulant layer 220 is 0.1 HU to 12 HU. In an embodiment, the light scattering value of the first portion of the upper encapsulant layer 220 is 0.1 HU to 11 HU. In an embodiment, the light scattering value of the first portion of the upper encapsulant layer 220 is 0.1 HU to 10 HU. In an embodiment, the light scattering value of the first portion of the upper encapsulant layer 220 is 0.1 HU to 9 HU. In an embodiment, the light scattering value of the first portion of the upper encapsulant layer 220 is 0.1 HU to 8 HU. In an embodiment, the light scattering value of the first portion of the upper encapsulant layer 220 is 0.1 HU to 7 HU. In an embodiment, the light scattering value of the first portion of the upper encapsulant layer 220 is 0.1 HU to 6 HU. In an embodiment, the light scattering value of the first portion of the upper encapsulant layer 220 is 0.1 HU to 5 HU. In an embodiment, the light scattering value of the first portion of the upper encapsulant layer 220 is 0.1 HU to 4 HU. In an embodiment, the light scattering value of the first portion of the upper encapsulant layer 220 is 0.1 HU to 3 HU. In an embodiment, the light scattering value of the first portion of the upper encapsulant layer 220 is 0.1 HU to 2 HU. In an embodiment, the light scattering value of the first portion of the upper encapsulant layer 220 is 0.1 HU to 1 HU. In an embodiment, the light scattering value of the first portion of the upper encapsulant layer 220 is 0.1 HU to 0.5 HU.

In an embodiment, the light scattering value of the first portion of the upper encapsulant layer 220 is 0.5 HU to 12 HU. In an embodiment, the light scattering value of the first portion of the upper encapsulant layer 220 is 0.5 HU to 11 HU. In an embodiment, the light scattering value of the first portion of the upper encapsulant layer 220 is 0.5 HU to 10 HU. In an embodiment, the light scattering value of the first portion of the upper encapsulant layer 220 is 0.5 HU to 9 HU. In an embodiment, the light scattering value of the first portion of the upper encapsulant layer 220 is 0.5 HU to 8 HU. In an embodiment, the light scattering value of the first portion of the upper encapsulant layer 220 is 0.5 HU to 7 HU. In an embodiment, the light scattering value of the first portion of the upper encapsulant layer 220 is 0.5 HU to 6 HU. In an embodiment, the light scattering value of the first portion of the upper encapsulant layer 220 is 0.5 HU to 5 HU. In an embodiment, the light scattering value of the first portion of the upper encapsulant layer 220 is 0.5 HU to 4

HU. In an embodiment, the light scattering value of the first portion of the upper encapsulant layer 220 is 0.5 HU to 3 HU. In an embodiment, the light scattering value of the first portion of the upper encapsulant layer 220 is 0.5 HU to 2 HU. In an embodiment, the light scattering value of the first portion of the upper encapsulant layer 220 is 0.5 HU to 1 HU.

In an embodiment, the light scattering value of the first portion of the upper encapsulant layer 220 is 1 HU to 12 HU. In an embodiment, the light scattering value of the first portion of the upper encapsulant layer 220 is 1 HU to 11 HU. In an embodiment, the light scattering value of the first portion of the upper encapsulant layer 220 is 1 HU to 10 HU. In an embodiment, the light scattering value of the first portion of the upper encapsulant layer 220 is 1 HU to 9 HU. In an embodiment, the light scattering value of the first portion of the upper encapsulant layer 220 is 1 HU to 8 HU. In an embodiment, the light scattering value of the first portion of the upper encapsulant layer 220 is 1 HU to 7 HU. In an embodiment, the light scattering value of the first portion of the upper encapsulant layer 220 is 1 HU to 6 HU. In an embodiment, the light scattering value of the first portion of the upper encapsulant layer 220 is 1 HU to 5 HU. In an embodiment, the light scattering value of the first portion of the upper encapsulant layer 220 is 1 HU to 4 HU. In an embodiment, the light scattering value of the first portion of the upper encapsulant layer 220 is 1 HU to 3 HU. In an embodiment, the light scattering value of the first portion of the upper encapsulant layer 220 is 1 HU to 2 HU.

In an embodiment, the light scattering value of the first portion of the upper encapsulant layer 220 is 2 HU to 12 HU. In an embodiment, the light scattering value of the first portion of the upper encapsulant layer 220 is 2 HU to 11 HU. In an embodiment, the light scattering value of the first portion of the upper encapsulant layer 220 is 2 HU to 10 HU. In an embodiment, the light scattering value of the first portion of the upper encapsulant layer 220 is 2 HU to 9 HU. In an embodiment, the light scattering value of the first portion of the upper encapsulant layer 220 is 2 HU to 8 HU. In an embodiment, the light scattering value of the first portion of the upper encapsulant layer 220 is 2 HU to 7 HU. In an embodiment, the light scattering value of the first portion of the upper encapsulant layer 220 is 2 HU to 6 HU. In an embodiment, the light scattering value of the first portion of the upper encapsulant layer 220 is 2 HU to 5 HU. In an embodiment, the light scattering value of the first portion of the upper encapsulant layer 220 is 2 HU to 4 HU. In an embodiment, the light scattering value of the first portion of the upper encapsulant layer 220 is 2 HU to 3 HU.

In an embodiment, the light scattering value of the first portion of the upper encapsulant layer 220 is 3 HU to 12 HU. In an embodiment, the light scattering value of the first portion of the upper encapsulant layer 220 is 3 HU to 11 HU. In an embodiment, the light scattering value of the first portion of the upper encapsulant layer 220 is 3 HU to 10 HU. In an embodiment, the light scattering value of the first portion of the upper encapsulant layer 220 is 3 HU to 9 HU. In an embodiment, the light scattering value of the first portion of the upper encapsulant layer 220 is 3 HU to 8 HU. In an embodiment, the light scattering value of the first portion of the upper encapsulant layer 220 is 3 HU to 7 HU. In an embodiment, the light scattering value of the first portion of the upper encapsulant layer 220 is 3 HU to 6 HU. In an embodiment, the light scattering value of the first portion of the upper encapsulant layer 220 is 3 HU to 5 HU. In an embodiment, the light scattering value of the first portion of the upper encapsulant layer 220 is 3 HU to 4 HU.

In an embodiment, the light scattering value of the first portion of the upper encapsulant layer 220 is 4 HU to 12 HU. In an embodiment, the light scattering value of the first portion of the upper encapsulant layer 220 is 4 HU to 11 HU. In an embodiment, the light scattering value of the first portion of the upper encapsulant layer 220 is 4 HU to 10 HU. In an embodiment, the light scattering value of the first portion of the upper encapsulant layer 220 is 4 HU to 9 HU. In an embodiment, the light scattering value of the first portion of the upper encapsulant layer 220 is 4 HU to 8 HU. In an embodiment, the light scattering value of the first portion of the upper encapsulant layer 220 is 4 HU to 7 HU. In an embodiment, the light scattering value of the first portion of the upper encapsulant layer 220 is 4 HU to 6 HU. In an embodiment, the light scattering value of the first portion of the upper encapsulant layer 220 is 4 HU to 5 HU.

In an embodiment, the light scattering value of the first portion of the upper encapsulant layer 220 is 5 HU to 12 HU. In an embodiment, the light scattering value of the first portion of the upper encapsulant layer 220 is 5 HU to 11 HU. In an embodiment, the light scattering value of the first portion of the upper encapsulant layer 220 is 5 HU to 10 HU. In an embodiment, the light scattering value of the first portion of the upper encapsulant layer 220 is 5 HU to 9 HU. In an embodiment, the light scattering value of the first portion of the upper encapsulant layer 220 is 5 HU to 8 HU. In an embodiment, the light scattering value of the first portion of the upper encapsulant layer 220 is 5 HU to 7 HU. In an embodiment, the light scattering value of the first portion of the upper encapsulant layer 220 is 5 HU to 6 HU.

In an embodiment, the light scattering value of the first portion of the upper encapsulant layer 220 is 6 HU to 12 HU. In an embodiment, the light scattering value of the first portion of the upper encapsulant layer 220 is 6 HU to 11 HU. In an embodiment, the light scattering value of the first portion of the upper encapsulant layer 220 is 6 HU to 10 HU. In an embodiment, the light scattering value of the first portion of the upper encapsulant layer 220 is 6 HU to 9 HU. In an embodiment, the light scattering value of the first portion of the upper encapsulant layer 220 is 6 HU to 8 HU. In an embodiment, the light scattering value of the first portion of the upper encapsulant layer 220 is 6 HU to 7 HU.

In an embodiment, the light scattering value of the first portion of the upper encapsulant layer 220 is 7 HU to 12 HU. In an embodiment, the light scattering value of the first portion of the upper encapsulant layer 220 is 7 HU to 11 HU. In an embodiment, the light scattering value of the first portion of the upper encapsulant layer 220 is 7 HU to 10 HU. In an embodiment, the light scattering value of the first portion of the upper encapsulant layer 220 is 7 HU to 9 HU. In an embodiment, the light scattering value of the first portion of the upper encapsulant layer 220 is 7 HU to 8 HU. In an embodiment, the light scattering value of the first portion of the upper encapsulant layer 220 is 8 HU to 12 HU. In an embodiment, the light scattering value of the first portion of the upper encapsulant layer 220 is 8 HU to 11 HU. In an embodiment, the light scattering value of the first portion of the upper encapsulant layer 220 is 8 HU to 10 HU. In an embodiment, the light scattering value of the first portion of the upper encapsulant layer 220 is 8 HU to 9 HU.

In an embodiment, the light scattering value of the first portion of the upper encapsulant layer 220 is 9 HU to 12 HU. In an embodiment, the light scattering value of the first portion of the upper encapsulant layer 220 is 9 HU to 11 HU. In an embodiment, the light scattering value of the first portion of the upper encapsulant layer 220 is 9 HU to 10 HU. In an embodiment, the light scattering value of the first portion of the upper encapsulant layer 220 is 10 HU to 12 HU. In an embodiment, the light scattering value of the first portion of the upper encapsulant layer 220 is 10 HU to 11 HU. In an embodiment, the light scattering value of the first portion of the upper encapsulant layer 220 is 11 HU to 12 HU.

In an embodiment, the light scattering value of the first portion of the upper encapsulant layer 220 is 0.1 HU. In an embodiment, the light scattering value of the first portion of the upper encapsulant layer 220 is 0.5 HU. In an embodiment, the light scattering value of the first portion of the upper encapsulant layer 220 is 1 HU. In an embodiment, the light scattering value of the first portion of the upper encapsulant layer 220 is 2 HU. In an embodiment, the light scattering value of the first portion of the upper encapsulant layer 220 is 3 HU. In an embodiment, the light scattering value of the first portion of the upper encapsulant layer 220 is 4 HU. In an embodiment, the light scattering value of the first portion of the upper encapsulant layer 220 is 5 HU. In an embodiment, the light scattering value of the first portion of the upper encapsulant layer 220 is 6 HU. In an embodiment, the light scattering value of the first portion of the upper encapsulant layer 220 is 7 HU. In an embodiment, the light scattering value of the first portion of the upper encapsulant layer 220 is 8 HU. In an embodiment, the light scattering value of the first portion of the upper encapsulant layer 220 is 9 HU. In an embodiment, the light scattering value of the first portion of the upper encapsulant layer 220 is 10 HU. In an embodiment, the light scattering value of the first portion of the upper encapsulant layer 220 is 11 HU. In an embodiment, the light scattering value of the first portion of the upper encapsulant layer 220 is 12 HU.

In an embodiment, the light scattering value of the second portion of the upper encapsulant layer 220 is 0.1 HU to 12 HU. In an embodiment, the light scattering value of the second portion of the upper encapsulant layer 220 is 0.1 HU to 11 HU. In an embodiment, the light scattering value of the second portion of the upper encapsulant layer 220 is 0.1 HU to 10 HU. In an embodiment, the light scattering value of the second portion of the upper encapsulant layer 220 is 0.1 HU to 9 HU. In an embodiment, the light scattering value of the second portion of the upper encapsulant layer 220 is 0.1 HU to 8 HU. In an embodiment, the light scattering value of the second portion of the upper encapsulant layer 220 is 0.1 HU to 7 HU. In an embodiment, the light scattering value of the second portion of the upper encapsulant layer 220 is 0.1 HU to 6 HU. In an embodiment, the light scattering value of the second portion of the upper encapsulant layer 220 is 0.1 HU to 5 HU. In an embodiment, the light scattering value of the second portion of the upper encapsulant layer 220 is 0.1 HU to 4 HU. In an embodiment, the light scattering value of the second portion of the upper encapsulant layer 220 is 0.1 HU to 3 HU. In an embodiment, the light scattering value of the second portion of the upper encapsulant layer 220 is 0.1 HU to 2 HU. In an embodiment, the light scattering value of the second portion of the upper encapsulant layer 220 is 0.1 HU to 1 HU. In an embodiment, the light scattering value of the second portion of the upper encapsulant layer 220 is 0.1 HU to 0.5 HU.

In an embodiment, the light scattering value of the second portion of the upper encapsulant layer 220 is 0.5 HU to 12 HU. In an embodiment, the light scattering value of the second portion of the upper encapsulant layer 220 is 0.5 HU to 11 HU. In an embodiment, the light scattering value of the second portion of the upper encapsulant layer 220 is 0.5 HU to 10 HU. In an embodiment, the light scattering value of the second portion of the upper encapsulant layer 220 is 0.5 HU to 9 HU. In an embodiment, the light scattering value of the second portion of the upper encapsulant layer 220 is 0.5 HU to 8 HU. In an embodiment, the light scattering value of the second portion of the upper encapsulant layer 220 is 0.5 HU to 7 HU. In an embodiment, the light scattering value of the second portion of the upper encapsulant layer 220 is 0.5 HU to 6 HU. In an embodiment, the light scattering value of the second portion of the upper encapsulant layer 220 is 0.5 HU to 5 HU. In an embodiment, the light scattering value of the second portion of the upper encapsulant layer 220 is 0.5 HU to 4 HU. In an embodiment, the light scattering value of the second portion of the upper encapsulant layer 220 is 0.5 HU to 3 HU. In an embodiment, the light scattering value of the second portion of the upper encapsulant layer 220 is 0.5 HU to 2 HU. In an embodiment, the light scattering value of the second portion of the upper encapsulant layer 220 is 0.5 HU to 1 HU.

In an embodiment, the light scattering value of the second portion of the upper encapsulant layer 220 is 1 HU to 12 HU. In an embodiment, the light scattering value of the second portion of the upper encapsulant layer 220 is 1 HU to 11 HU. In an embodiment, the light scattering value of the second portion of the upper encapsulant layer 220 is 1 HU to 10 HU. In an embodiment, the light scattering value of the second portion of the upper encapsulant layer 220 is 1 HU to 9 HU. In an embodiment, the light scattering value of the second portion of the upper encapsulant layer 220 is 1 HU to 8 HU. In an embodiment, the light scattering value of the second portion of the upper encapsulant layer 220 is 1 HU to 7 HU. In an embodiment, the light scattering value of the second portion of the upper encapsulant layer 220 is 1 HU to 6 HU. In an embodiment, the light scattering value of the second portion of the upper encapsulant layer 220 is 1 HU to 5 HU. In an embodiment, the light scattering value of the second portion of the upper encapsulant layer 220 is 1 HU to 4 HU. In an embodiment, the light scattering value of the second portion of the upper encapsulant layer 220 is 1 HU to 3 HU. In an embodiment, the light scattering value of the second portion of the upper encapsulant layer 220 is 1 HU to 2 HU.

In an embodiment, the light scattering value of the second portion of the upper encapsulant layer 220 is 2 HU to 12 HU. In an embodiment, the light scattering value of the second portion of the upper encapsulant layer 220 is 2 HU to 11 HU. In an embodiment, the light scattering value of the second portion of the upper encapsulant layer 220 is 2 HU to 10 HU. In an embodiment, the light scattering value of the second portion of the upper encapsulant layer 220 is 2 HU to 9 HU. In an embodiment, the light scattering value of the second portion of the upper encapsulant layer 220 is 2 HU to 8 HU. In an embodiment, the light scattering value of the second portion of the upper encapsulant layer 220 is 2 HU to 7 HU. In an embodiment, the light scattering value of the second portion of the upper encapsulant layer 220 is 2 HU to 6 HU. In an embodiment, the light scattering value of the second portion of the upper encapsulant layer 220 is 2 HU to 5 HU. In an embodiment, the light scattering value of the second portion of the upper encapsulant layer 220 is 2 HU to 4 HU. In an embodiment, the light scattering value of the second portion of the upper encapsulant layer 220 is 2 HU to 3 HU.

In an embodiment, the light scattering value of the second portion of the upper encapsulant layer 220 is 3 HU to 12 HU. In an embodiment, the light scattering value of the second portion of the upper encapsulant layer 220 is 3 HU to 11 HU. In an embodiment, the light scattering value of the second portion of the upper encapsulant layer 220 is 3 HU to 10 HU. In an embodiment, the light scattering value of the second portion of the upper encapsulant layer 220 is 3 HU to 9 HU.

In an embodiment, the light scattering value of the second portion of the upper encapsulant layer 220 is 3 HU to 8 HU. In an embodiment, the light scattering value of the second portion of the upper encapsulant layer 220 is 3 HU to 7 HU. In an embodiment, the light scattering value of the second portion of the upper encapsulant layer 220 is 3 HU to 6 HU. In an embodiment, the light scattering value of the second portion of the upper encapsulant layer 220 is 3 HU to 5 HU. In an embodiment, the light scattering value of the second portion of the upper encapsulant layer 220 is 3 HU to 4 HU.

In an embodiment, the light scattering value of the second portion of the upper encapsulant layer 220 is 4 HU to 12 HU. In an embodiment, the light scattering value of the second portion of the upper encapsulant layer 220 is 4 HU to 11 HU. In an embodiment, the light scattering value of the second portion of the upper encapsulant layer 220 is 4 HU to 10 HU. In an embodiment, the light scattering value of the second portion of the upper encapsulant layer 220 is 4 HU to 9 HU. In an embodiment, the light scattering value of the second portion of the upper encapsulant layer 220 is 4 HU to 8 HU. In an embodiment, the light scattering value of the second portion of the upper encapsulant layer 220 is 4 HU to 7 HU. In an embodiment, the light scattering value of the second portion of the upper encapsulant layer 220 is 4 HU to 6 HU. In an embodiment, the light scattering value of the second portion of the upper encapsulant layer 220 is 4 HU to 5 HU.

In an embodiment, the light scattering value of the second portion of the upper encapsulant layer 220 is 5 HU to 12 HU. In an embodiment, the light scattering value of the second portion of the upper encapsulant layer 220 is 5 HU to 11 HU. In an embodiment, the light scattering value of the second portion of the upper encapsulant layer 220 is 5 HU to 10 HU. In an embodiment, the light scattering value of the second portion of the upper encapsulant layer 220 is 5 HU to 9 HU. In an embodiment, the light scattering value of the second portion of the upper encapsulant layer 220 is 5 HU to 8 HU. In an embodiment, the light scattering value of the second portion of the upper encapsulant layer 220 is 5 HU to 7 HU. In an embodiment, the light scattering value of the second portion of the upper encapsulant layer 220 is 5 HU to 6 HU.

In an embodiment, the light scattering value of the second portion of the upper encapsulant layer 220 is 6 HU to 12 HU. In an embodiment, the light scattering value of the second portion of the upper encapsulant layer 220 is 6 HU to 11 HU. In an embodiment, the light scattering value of the second portion of the upper encapsulant layer 220 is 6 HU to 10 HU. In an embodiment, the light scattering value of the second portion of the upper encapsulant layer 220 is 6 HU to 9 HU. In an embodiment, the light scattering value of the second portion of the upper encapsulant layer 220 is 6 HU to 8 HU. In an embodiment, the light scattering value of the second portion of the upper encapsulant layer 220 is 6 HU to 7 HU.

In an embodiment, the light scattering value of the second portion of the upper encapsulant layer 220 is 7 HU to 12 HU. In an embodiment, the light scattering value of the second portion of the upper encapsulant layer 220 is 7 HU to 11 HU. In an embodiment, the light scattering value of the second portion of the upper encapsulant layer 220 is 7 HU to 10 HU. In an embodiment, the light scattering value of the second portion of the upper encapsulant layer 220 is 7 HU to 9 HU. In an embodiment, the light scattering value of the second portion of the upper encapsulant layer 220 is 7 HU to 8 HU. In an embodiment, the light scattering value of the second portion of the upper encapsulant layer 220 is 8 HU to 12 HU. In an embodiment, the light scattering value of the second portion of the upper encapsulant layer 220 is 8 HU to 11 HU. In an embodiment, the light scattering value of the second portion of the upper encapsulant layer 220 is 8 HU to 10 HU. In an embodiment, the light scattering value of the second portion of the upper encapsulant layer 220 is 8 HU to 9 HU.

In an embodiment, the light scattering value of the second portion of the upper encapsulant layer 220 is 9 HU to 12 HU. In an embodiment, the light scattering value of the second portion of the upper encapsulant layer 220 is 9 HU to 11 HU. In an embodiment, the light scattering value of the second portion of the upper encapsulant layer 220 is 9 HU to 10 HU. In an embodiment, the light scattering value of the second portion of the upper encapsulant layer 220 is 10 HU to 12 HU. In an embodiment, the light scattering value of the second portion of the upper encapsulant layer 220 is 10 HU to 11 HU. In an embodiment, the light scattering value of the second portion of the upper encapsulant layer 220 is 11 HU to 12 HU.

In an embodiment, the light scattering value of the second portion of the upper encapsulant layer 220 is 0.1 HU. In an embodiment, the light scattering value of the second portion of the upper encapsulant layer 220 is 0.5 HU. In an embodiment, the light scattering value of the second portion of the upper encapsulant layer 220 is 1 HU. In an embodiment, the light scattering value of the second portion of the upper encapsulant layer 220 is 2 HU. In an embodiment, the light scattering value of the second portion of the upper encapsulant layer 220 is 3 HU. In an embodiment, the light scattering value of the second portion of the upper encapsulant layer 220 is 4 HU. In an embodiment, the light scattering value of the second portion of the upper encapsulant layer 220 is 5 HU. In an embodiment, the light scattering value of the second portion of the upper encapsulant layer 220 is 6 HU. In an embodiment, the light scattering value of the second portion of the upper encapsulant layer 220 is 7 HU. In an embodiment, the light scattering value of the second portion of the upper encapsulant layer 220 is 8 HU. In an embodiment, the light scattering value of the second portion of the upper encapsulant layer 220 is 9 HU. In an embodiment, the light scattering value of the second portion of the upper encapsulant layer 220 is 10 HU. In an embodiment, the light scattering value of the second portion of the upper encapsulant layer 220 is 11 HU. In an embodiment, the light scattering value of the second portion of the upper encapsulant layer 220 is 12 HU.

In an embodiment, a light scattering effect of the first portion of the upper encapsulant layer 220 is different than a light scattering value effect of the second portion of the upper encapsulant layer 220. In an embodiment, the light scattering effect of the first portion and the light scattering effect of the second portion of the upper encapsulant layer 220 are visually perceptible by a human. In an embodiment, the visual perception of the light scattering effect of the first portion and the light scattering effect of the second portion of the upper encapsulant layer 220 are subjective to the human.

In some embodiments, the light scatting properties of the portions of the upper encapsulant layer 220 vary as a result of the degree of crystallinity in each such portion. In some embodiments, the degree of crystallinity in each portion depends on the rate of cooling of each portion. In some embodiments, variations in crystallinity result in varying degrees of light scattering (e.g., redirection), resulting in a visual appearance of difference in coloration. In some embodiments, variation in light scattering properties does not result in a significant decrease in overall power of light transmitted through the upper encapsulant layer 220 having such portions (e.g., less than 2% relative to an encapsulant equivalent to the upper encapsulant layer 220 but exhibiting substantially no light scattering). In other embodiments, a color coordinate and color difference values of each of the at least two portions of the upper encapsulant layer can be quantified in accordance with the ASTM E1347 Standard Test Method for Color and Color-Difference Measurement by Tristimulus Colorimetry.

In some embodiments, variations in the light scattering properties of different portions of the upper encapsulant layer 220 are achieved by selectively cooling some portions of the upper encapsulant layer 220 more quickly or slowly than others during the lamination process (e.g., the process by which the layers shown in FIG. 2A are combined to produce the layered structure shown in FIG. 2B). In some embodiments, variations in the light scattering properties of different portions of the upper encapsulant layer 220 are achieved by placing pieces of light-scattering materials (e.g., portions of the encapsulant material of the upper encapsulant layer 220 that have different light-scattering properties) within the upper encapsulant layer 220 before the lamination process.

Figure 3A:
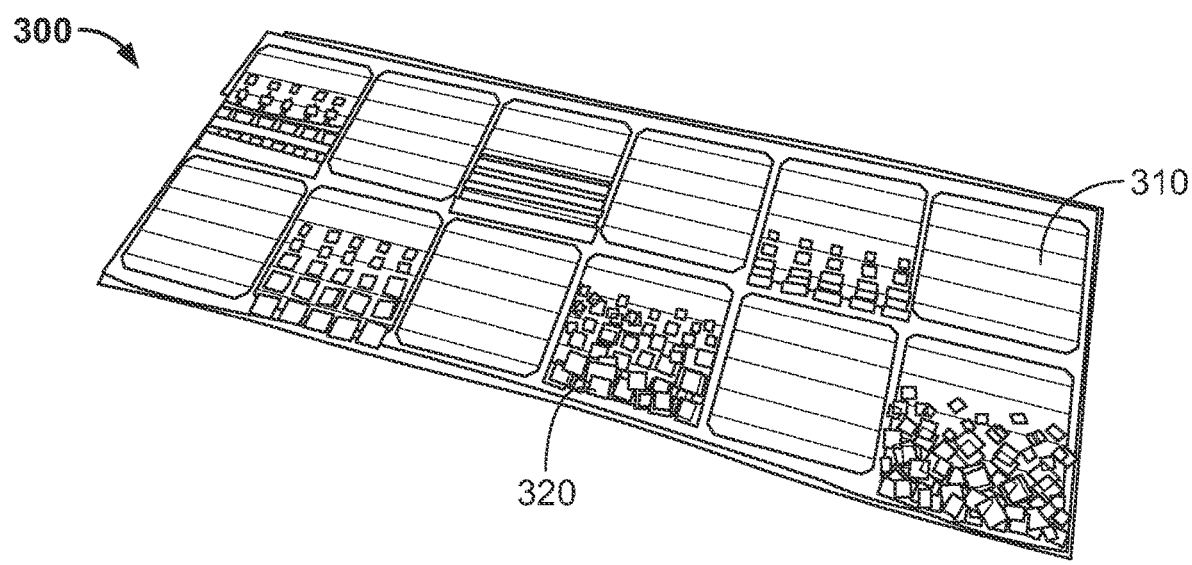
FIG. 3A shows a prototype of elements of a layered structure of an exemplary PV module including an upper encapsulant layer with non-uniform light-scattering elements before lamination.
Figure 3B:
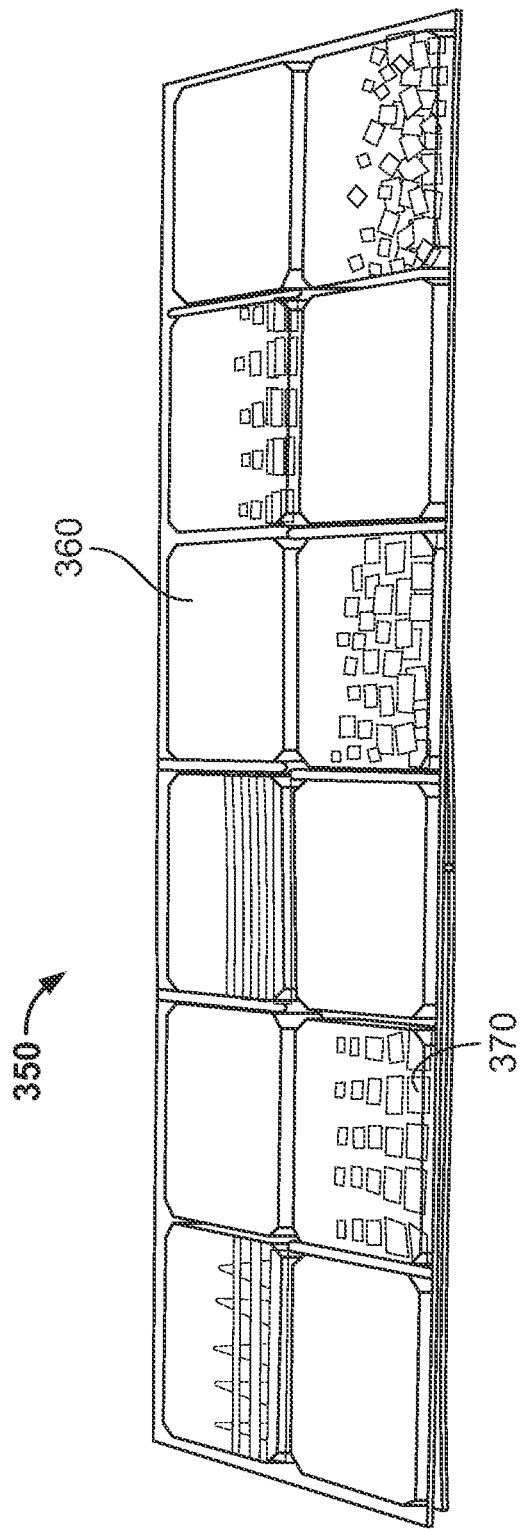
FIG. 3B shows a layered structure of an exemplary PV module formed by lamination of the elements shown in FIG. 3A.

FIG. 3A shows a photograph of a prototype 300 of the prototype layered structure before lamination such as that shown in FIG. 2A, with portions 310 of standard (e.g., not exhibiting significant light-scattering properties) encapsulant and portions 320 of light-scattering encapsulant included within the upper encapsulant layer 220 before lamination. FIG. 3B shows a photograph of a prototype 350 of a layered structure made by lamination of the prototype 300 shown in FIG. 3A. It may be seen that the portions 310 of standard encapsulant produce first portions 360 of the upper encapsulant layer 220 having a first appearance, and that the portions 320 of the light-scattering encapsulant included in the upper encapsulant layer 220 produce non-uniform portions 370 in the prototype 350 that impart a random appearance to the prototype 350. For clarity, though the prototype 300 and the prototype 350 include several of the portions 310 and 320 and the portions 360 and 370, respectively, only one of each of the portions 310 and 320 and the portions 360 and 370 are specifically identified using these reference numbers in FIGS. 3A and 3B.

In some embodiments, the upper encapsulant layer 220 is formed through the use of an encapsulant that has light scattering patterning pre-formed therein. In some embodiments, an encapsulant having light-scattering patterning pre-formed therein is formed by coextruding embossed layers (e.g., layers having an embossed region of a light-scattering pattern textured on a surface thereof) and non-embossed layers (e.g., layers lacking a light-scattering pattern) to produce a single ply of an encapsulant having light-scattering patterning pre-formed therein. In some embodiments, such a coextrusion process is performed using one, or two, or, three, or four of the embossed layers. In some embodiments, such a coextrusion process is performed using zero, or one, or two, or three, or four of the non-embossed layers. In some embodiments, the thickness of each individual layer (e.g., each of the embossed layers and each of the non-embossed layers) is 100 microns to 450 microns. FIGS. 4-7 schematically illustrate exemplary processes for fabricating an encapsulant having a light-scattering pattern pre-formed therein. It will be apparent to those of skill in the art that the specific patterns shown in FIGS. 4-7 are only exemplary and that any desired pattern may be provided using the same techniques described herein. In some embodiments, an encapsulant sheet having light-scattering patterning pre-formed therein may improve the throughput of a manufacturing facility that is performing the lamination process described above with reference to FIGS. 2A and 2B.

Figure 4:
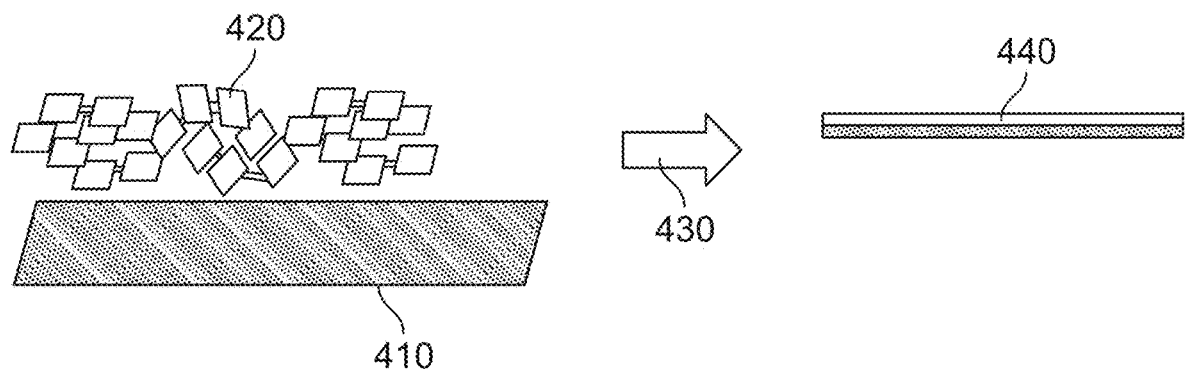
FIG. 4 shows a schematic view of a first exemplary process for fabricating an encapsulant having light-scattering patterning pre-formed therein.

FIG. 4 schematically illustrates a first exemplary process for fabricating an encapsulant having light-scattering patterning pre-formed therein. The process shown in FIG. 4 uses, as feed stock, a first encapsulant layer 410 that is a non-embossed layer and a second encapsulant layer 420 that is an embossed layer. In some embodiments, the first encapsulant layer 410 and the second encapsulant layer 420 comprise the same material as one another. In some embodiments, the first encapsulant layer 410 and the second encapsulant layer 420 comprise different materials than one another. The first encapsulant layer 410 and the second encapsulant layer 420 are combined by a conversion process or coextrusion process 430 to produce an encapsulant 440 that has a light-scattering pattern pre-formed therein.

Figure 5:
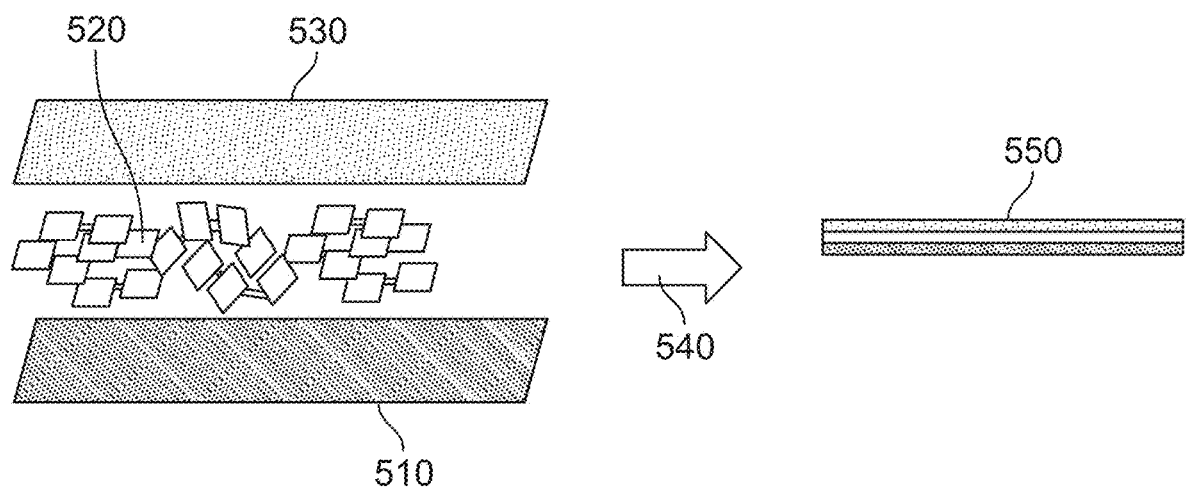
FIG. 5 shows a schematic view of a second exemplary process for fabricating an encapsulant having light-scattering patterning pre-formed therein.

FIG. 5 schematically illustrates a second exemplary process for fabricating an encapsulant having light-scattering patterning pre-formed therein. The process shown in FIG. 5 uses, as feed stock, a first encapsulant layer 510 that is a non-embossed layer, a second encapsulant layer 520 that is an embossed layer, and a third encapsulant layer 530 that is a non-embossed layer. In the embodiment shown in FIG. 5, the embossed layer 520 is sandwiched between the non-embossed, first encapsulant layer 510 and the non-embossed, third encapsulant layer 530. In some embodiments, the first encapsulant layer 510, the second encapsulant layer 520, and the third encapsulant layer 530 comprise the same material as one another. In some embodiments, the first encapsulant layer 510, the second encapsulant layer 520, and the third encapsulant layer 530 comprise different materials than one another. The first encapsulant layer 510, the second encapsulant layer 520, and the third encapsulant layer 530 are combined by a conversion process or coextrusion process 540 to produce an encapsulant 550 that has a light-scattering pattern pre-formed therein.

Figure 6:
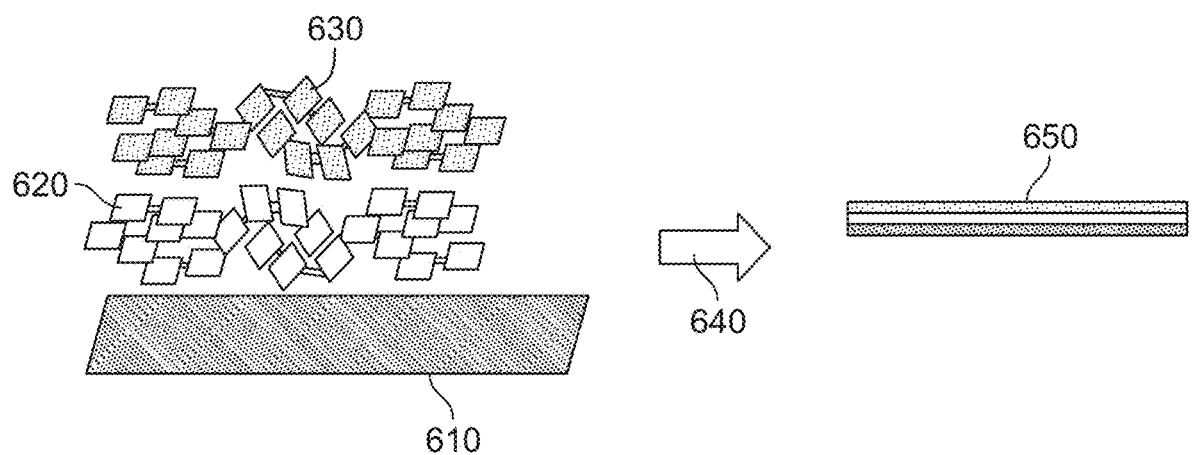
FIG. 6 shows a schematic view of a third exemplary process for fabricating an encapsulant having light-scattering patterning pre-formed therein.

FIG. 6 schematically illustrates a third exemplary process for fabricating an encapsulant having light-scattering patterning pre-formed therein. The process shown in FIG. 6 uses, as feed stock, a first encapsulant layer 610 that is a non-embossed layer, a second encapsulant layer 620 that is an embossed layer, and a third encapsulant layer 630 that is an embossed layer. In the embodiment shown in FIG. 5, the embossed, second encapsulant layer 620 and third encapsulant layer 630 is sandwiched are adjacent to one another to one side of the non-embossed, first encapsulant layer 610. In some embodiments, the first encapsulant layer 610, the second encapsulant layer 620, and the third encapsulant layer 630 comprise the same material as one another. In some embodiments, the first encapsulant layer 610, the second encapsulant layer 620, and the third encapsulant layer 630 comprise different materials than one another. The first encapsulant layer 610, the second encapsulant layer 620, and the third encapsulant layer 630 are combined by a conversion process or coextrusion process 640 to produce an encapsulant 650 that has a light-scattering pattern pre-formed therein.

Figure 7:
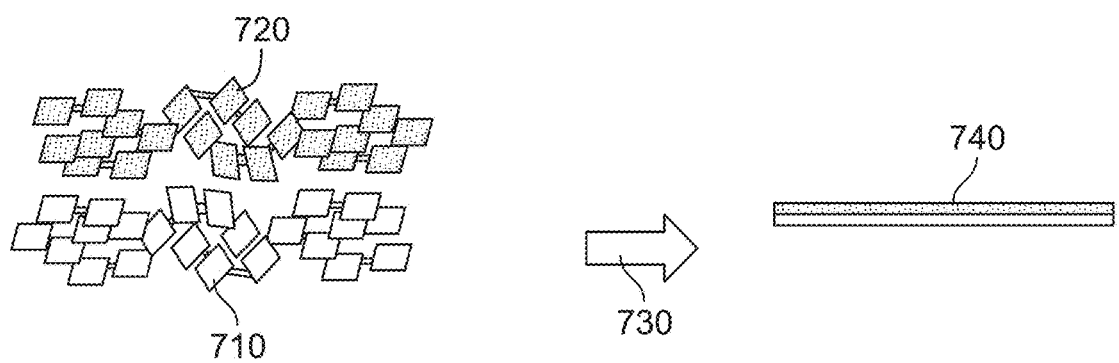
FIG. 7 shows a schematic view of a fourth exemplary process for fabricating an encapsulant having light-scattering patterning pre-formed therein.

FIG. 7 schematically illustrates a fourth exemplary process for fabricating an encapsulant having light-scattering patterning pre-formed therein. The process shown in FIG. 4 uses, as feed stock, a first encapsulant layer 710 that is an embossed layer and a second encapsulant layer 720 that is an embossed layer. In some embodiments, the first encapsulant layer 710 and the second encapsulant layer 720 comprise the same material as one another. In some embodiments, the first encapsulant layer 710 and the second encapsulant layer 720 comprise different materials than one another. The first encapsulant layer 710 and the second encapsulant layer 720 are combined by a conversion process or coextrusion process 730 to produce an encapsulant 740 that has a light-scattering pattern pre-formed therein.

Referring now to FIGS. 8A through 8E, top views of exemplary patterns 800, 820, 840, 860, 880 of the non-uniform portions 370 are shown. The pattern 800 shown in FIG. 8A includes a pattern of squares. The pattern 820 shown in FIG. 8B includes a pattern of non-rectangular quadrilaterals (e.g., lozenges). The pattern 840 shown in FIG. 8C includes a pattern of circles. The pattern 860 shown in FIG. 8D includes a pattern of hexagons. In some embodiments, the upper encapsulant layer 220 includes a pattern including one or more types of polygons, such as triangles, quadrilaterals, pentagons, hexagons, etc. For example, the pattern 880 shown in FIG. 8E includes a pattern of triangles and a pattern of circles. It will be apparent to those of skill in the art that the specific patterns 800, 820, 840, 860, 880 shown in FIGS. 8A-8E are only exemplary and that any number of other geometric or non-geometric patterns are possible. In some embodiments, the upper encapsulant layer 220 includes a uniform pattern. In some embodiments, the upper encapsulant layer 220 includes a non-uniform pattern. In some embodiments, the upper encapsulant layer 220 includes a combination of patterns in combination with one another. In some embodiments, the upper encapsulant layer 220 includes a pattern having a size gradient (e.g., including similarly shaped elements of different sizes, such as differently sized triangles, adjacent to one another).

Figure 8A:
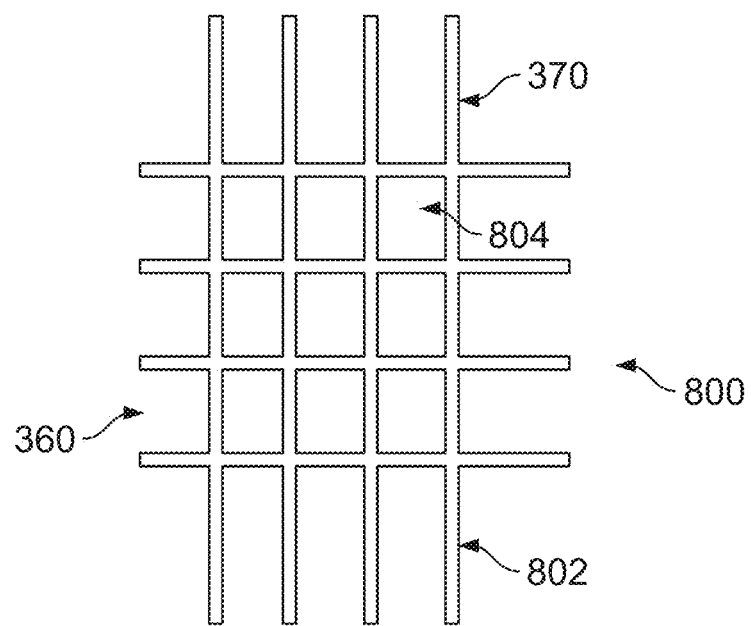
FIG. 8A shows a first exemplary pattern of non-uniform light-scattering portions in a superstrate of an exemplary PV module.

In some embodiments, the pattern 800, 820, 840, 860, or 880 includes a mesh 802, 822, 842, 862, 882 of the non-uniform portions 370 and a plurality of openings 804, 824, 844, 864, 884 defined by the respective mesh 802, 822, 842, 862, 882 (for clarity, only one of the openings 804, 824, 844, 864, 884 is specifically identified in the respective one of FIGS. 8A-8E). In some embodiments, the non-uniform portions 370 forming the mesh 802, 822, 842, 862, 882 are equally spaced across the entire mesh 802, 822, 842, 862, 882. For example, FIG. 8A shows a mesh 802 of squares formed by non-uniform portions that are evenly spaced at 3-millimeter intervals. In some embodiments, the non-uniform portions 370 are irregularly spaced. In some embodiments, each of the openings has a surface area of 1 square millimeter to 20 square millimeters, with the surface area being measured between the edges of each of the non-uniform portions 370 surrounding a given opening. For example, referring to FIG. 8A, each of the non-uniform portions 370 forming the mesh 802 is represented by a line, with the thickness of each line representing the width of each of the non-uniform portions 370 from one edge to the opposing edge. As shown in FIG. 8A, each of the openings 804 is represented by the white space between the lines representing the non-uniform portions 370. The area of each of the white space regions corresponds to the surface area of the corresponding one of the openings 804.

In some embodiments, each of the openings has a surface area of 1 square millimeter to 15 square millimeters. In some embodiments, each of the openings has a surface area of 1 square millimeter to 10 square millimeters. In some embodiments, each of the openings has a surface area of 5 square millimeters to 20 square millimeters. In some embodiments, each of the openings has a surface area of 5 square millimeters to 15 square millimeters. In some embodiments, each of the openings has a surface area of 5 square millimeters to 10 square millimeters. In some embodiments, each of the openings has a surface area of 10 square millimeters to 20 square millimeters. In some embodiments, each of the openings has a surface area of 10 square millimeters to 15 square millimeters. In some embodiments, each of the openings has a surface area of 15 square millimeters to 20 square millimeters. In some embodiments, each of the openings has a surface area of 1 square millimeter to 9 square millimeters. In some embodiments, each of the openings has a surface area of 1 square millimeter to 5 square millimeters. In some embodiments, each of the openings has a surface area of 5 square millimeters to 9 square millimeters.

In some embodiments, PV module 100 having a layered structure 200 including an upper encapsulant layer 220 with portions with varying light-scattering properties having a pattern as described provides little to no loss of transmission power (i.e., power of transmitted light) as compared to a comparison PV module that is identical to the PV module 100 but includes an upper encapsulant layer 220 exhibiting substantially no light-scattering properties. In some embodiments, the transmission power loss is less than 2%.

In some embodiments, a PV module 100 having a layered structure 200 including a superstrate with non-uniform portions 370 having a pattern as described above mimics the appearance of asphalt shingles that may form at least a portion of a roof on which the PV module 100 is to be installed. In some embodiments, a single one of the PV module 100 includes the non-uniform portions 370 forming differing patterns at differing portions of the superstrate layer 210. In some embodiments, by including different patterns of the non-uniform portions 370 and randomizing the arrangement of the patterns, the PV module 100 can have variation in its apparent color and mimic the appearance of adjacent asphalt shingles.

Figure 8B:
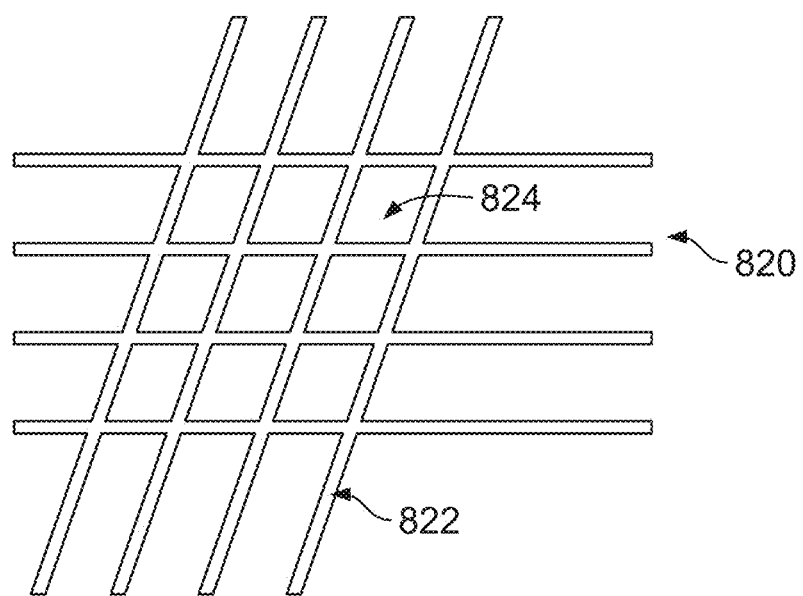
FIG. 8B shows a second exemplary pattern of non-uniform light-scattering portions in a superstrate of an exemplary PV module.
Figure 8C:
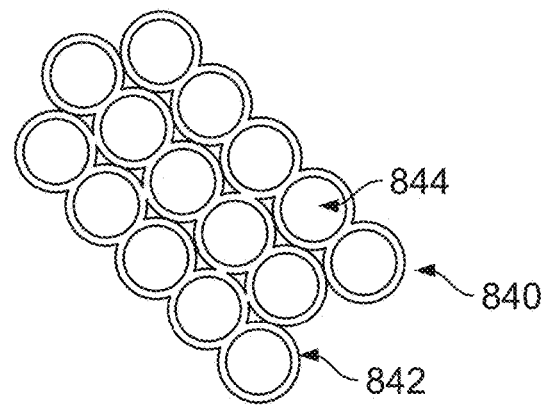
FIG. 8C shows a third exemplary pattern of non-uniform light-scattering portions in a superstrate of an exemplary PV module.
Figure 8D:
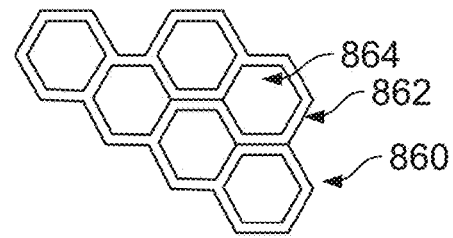
FIG. 8D shows a fourth exemplary pattern of non-uniform light-scattering portions in a superstrate of an exemplary PV module.
Figure 8E:
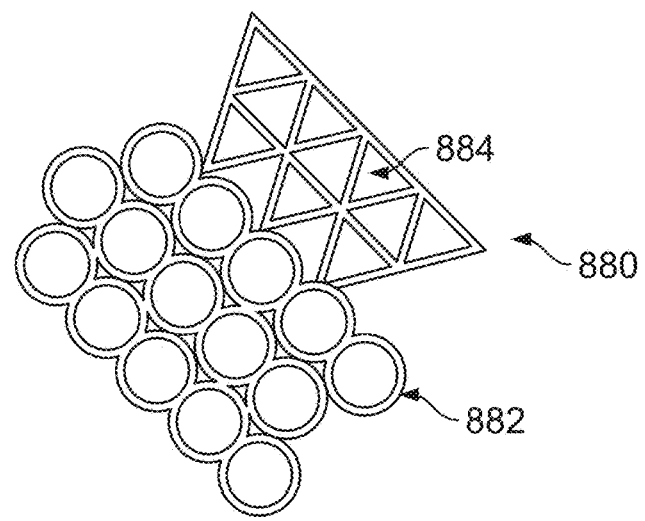
FIG. 8E shows a fifth exemplary pattern of non-uniform light-scattering portions in a superstrate of an exemplary PV module.

In some embodiments, a PV system including a plurality of the PV module 100 will include some of the PV module 100 having different patterns than others (e.g., one of the PV module will include the pattern 800 shown in FIG. 8A, another of the PV module 100 will include the pattern 820 shown in FIG. 8B, etc.). In some embodiments, to provide a random appearance to the PV system mimicking the random appearance of a roof including asphalt shingles, the PV modules 100 are not allowed to repeat patterns within a certain number of the PV modules 100 either vertically or horizontally. For example, in some embodiments, the PV modules 100 are not allowed to repeat patterns within one of the PV modules 100 or horizontally, or within two of the PV modules 100 or horizontally, or within three of the PV modules 100 or horizontally, or within four of the PV modules 100 or horizontally, etc.

In an embodiment, the upper surface 212 of the superstrate layer 210 is hazed. In an embodiment, the entire surface area of the upper surface 212 of the superstrate layer 210 is hazed. In an embodiment, 40% to 100% of the upper surface 212 of the superstrate layer 210 is hazed. In an embodiment, 40% to 90% of the upper surface 212 of the superstrate layer 210 is hazed. In an embodiment, 40% to 80% of the upper surface 212 of the superstrate layer 210 is hazed. In an embodiment, 40% to 70% of the upper surface 212 of the superstrate layer 210 is hazed. In an embodiment, 40% to 60% of the upper surface 212 of the superstrate layer 210 is hazed. In an embodiment, 40% to 50% of the upper surface 212 of the superstrate layer 210 is hazed. In an embodiment, the upper surface 212 of the superstrate layer 210 is hazed. In an embodiment, the entire surface area of the upper surface 212 of the superstrate layer 210 is hazed. In an embodiment, 50% to 100% of the upper surface 212 of the superstrate layer 210 is hazed. In an embodiment, 50% to 90% of the upper surface 212 of the superstrate layer 210 is hazed. In an embodiment, 50% to 80% of the upper surface 212 of the superstrate layer 210 is hazed. In an embodiment, 50% to 70% of the upper surface 212 of the superstrate layer 210 is hazed. In an embodiment, 50% to 60% of the upper surface 212 of the superstrate layer 210 is hazed.

In an embodiment, 60% to 100% of the upper surface 212 of the superstrate layer 210 is hazed. In an embodiment, 60% to 90% of the upper surface 212 of the superstrate layer 210 is hazed. In an embodiment, 60% to 80% of the upper surface 212 of the superstrate layer 210 is hazed. In an embodiment, 60% to 70% of the upper surface 212 of the superstrate layer 210 is hazed. In an embodiment, 70% to 100% of the upper surface 212 of the superstrate layer 210 is hazed. In an embodiment, 70% to 90% of the upper surface 212 of the superstrate layer 210 is hazed. In an embodiment, 70% to 80% of the upper surface 212 of the superstrate layer 210 is hazed. In an embodiment, 80% to 100% of the upper surface 212 of the superstrate layer 210 is hazed. In an embodiment, 80% to 90% of the upper surface 212 of the superstrate layer 210 is hazed. In an embodiment, 90% to 100% of the upper surface 212 of the superstrate layer 210 is hazed.

In an embodiment, 40% of the upper surface 212 of the superstrate layer 210 is hazed. In an embodiment, 50% of the upper surface 212 of the superstrate layer 210 is hazed. In an embodiment, 60% of the upper surface 212 of the superstrate layer 210 is hazed. In an embodiment, 70% of the upper surface 212 of the superstrate layer 210 is hazed. In an embodiment, 80% of the upper surface 212 of the superstrate layer 210 is hazed. In an embodiment, 90% of the upper surface 212 of the superstrate layer 210 is hazed. In an embodiment, 99.9% of the upper surface 212 of the superstrate layer 210 is hazed. In an embodiment, 100% of the upper surface 212 of the superstrate layer 210 is hazed.

In an embodiment, the superstrate layer 210 includes a solar weighted transmittance of 80% to 95%. In an embodiment, the superstrate layer 210 includes a solar weighted transmittance of 80% to 90%. In an embodiment, the superstrate layer 210 includes a solar weighted transmittance of 80% to 85%. In an embodiment, the superstrate layer 210 includes a solar weighted transmittance of 85% to 95%. In an embodiment, the superstrate layer 210 includes a solar weighted transmittance of 85% to 90%. In an embodiment, the superstrate layer 210 includes a solar weighted transmittance of 90% to 95%.

In an embodiment, the PV module 100 is configured to be installed on a roof deck. In an embodiment, the roof deck is steep slope roof deck. As defined herein, a "steep slope roof deck" is any roof deck that is disposed on a roof having a pitch of Y/X, where Y and X are in a ratio of 4:12 to 12:12, where Y corresponds to the "rise" of the roof, and where X corresponds to the "run" of the roof. In an embodiment, the PV module 100 is an electrically active photovoltaic module. In another embodiment, the PV module 100 is an electrically inactive photovoltaic module. In an embodiment, the PV module 100 when electrically inactive meets standards of California Building Energy Efficiency Standards of Residential and Nonresidential Buildings, Title 24, Part 6. In an embodiment, the PV module 100 meets the standards of California Building Energy Efficiency Standards of Residential and Nonresidential Buildings, Title 24, Part 6. In an embodiment, the PV module 100 when electrically inactive is not electrically connected to an electrical system or any other electrical components of a solar roofing system. In an embodiment, the PV module 100 when electrically inactive 100 does not include any of the at least one PV element 236. In an embodiment, the PV module 100 when electrically inactive includes a solar reflectivity index (SRI) of 16. In an embodiment, the PV module 100 when electrically inactive includes a solar reflectivity index (SRI) of greater than 16.

In some embodiments, a PV system including a plurality of the PV module also includes at least one starter bar, a foot module, and a plurality of water shedding layers. In some embodiments, the at least one PV module includes an upper portion and a lower portion and is configured to be installed such that the upper portion is at a higher elevation than the lower portion. In some embodiments, the at least one starter bar is configured to be installed to a roof deck and includes a foot base. In some embodiments, a first one of the water shedding layers is configured to be installed over the foot base of the at least one starter bar, and at least one other one of the water shedding layers is configured to overlap and be installed over the first one of the plurality of water shedding layers. In some embodiments, the foot module is configured to be attached to the upper portion of the at least one photovoltaic module. In some embodiments, the lower portion of the at least one first PV module is adapted to align with the foot base of the at least one starter bar, and the foot module is configured to be affixed to a last overlapping layer of the at least one of another of the first plurality of water shedding layers to the roof deck.

Figure 9:
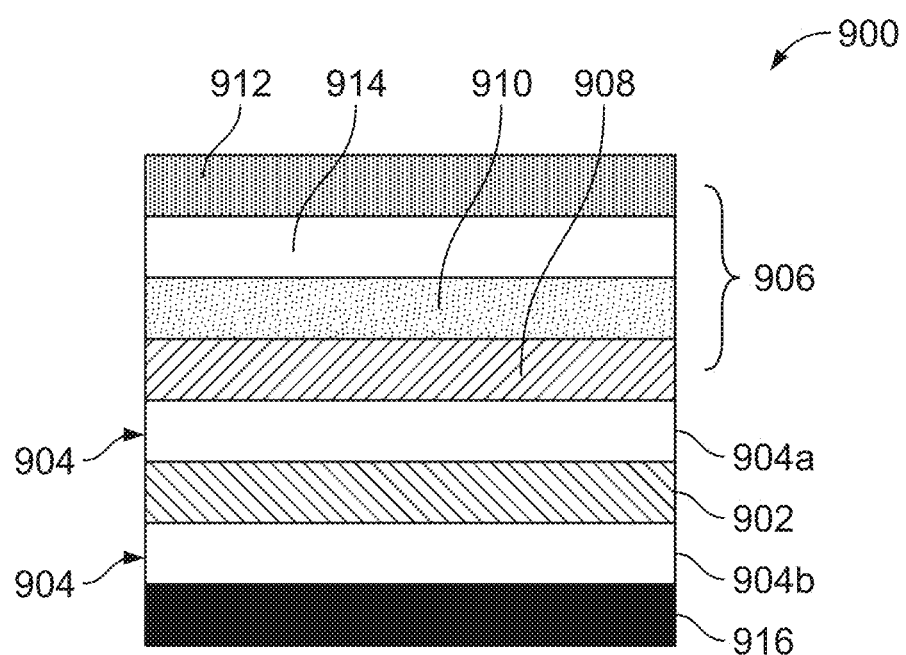
FIG. 9 shows an embodiment of a PV module.

Referring to FIG. 9, in an embodiment, a photovoltaic module 900 includes at least one solar cell 902, an encapsulant 904 encapsulating the at least one solar cell 902, and a frontsheet 906 juxtaposed with the encapsulant 904. As used herein, the terms "encapsulating" and "encapsulates" mean to partially or fully envelope or enclose, and with respect to certain embodiments of the photovoltaic module 900, the at least one solar cell 902 is fully enveloped by or enclosed within the encapsulant 904, or partially enveloped by or enclosed within the encapsulant 904. In an embodiment, the encapsulant 904 includes a first layer 904a and a second layer 904b.

In an embodiment, the encapsulant 904 may be made from polyolefins, ethyl vinyl acetates, ionomers, silicones, poly vinyl butyral, epoxies, polyurethanes, or combinations/hybrids thereof. In an embodiment, the encapsulant 904 is made from thermosetting polyolefin.

In an embodiment, the encapsulant 904 includes a thickness of 0.4 mm to 1.8 mm. In another embodiment, the encapsulant 904 includes a thickness of 0.4 mm to 1.7 mm. In another embodiment, the encapsulant 904 includes a thickness of 0.4 mm to 1.6 mm. In another embodiment, the encapsulant 904 includes a thickness of 0.4 mm to 1.5 mm. In another embodiment, the encapsulant 904 includes a thickness of 0.4 mm to 1.4 mm. In another embodiment, the encapsulant 904 includes a thickness of 0.4 mm to 1.3 mm. In another embodiment, the encapsulant 904 includes a thickness of 0.4 mm to 1.2 mm. In another embodiment, the encapsulant 904 includes a thickness of 0.4 mm to 1.1 mm. In another embodiment, the encapsulant 904 includes a thickness of 0.4 mm to 1.0 mm. In another embodiment, the encapsulant 904 includes a thickness of 0.4 mm to 0.9 mm. In another embodiment, the encapsulant 904 includes a thickness of 0.4 mm to 0.8 mm. In another embodiment, the encapsulant 904 includes a thickness of 0.4 mm to 0.7 mm. In another embodiment, the encapsulant 904 includes a thickness of 0.4 mm to 0.6 mm. In another embodiment, the encapsulant 904 includes a thickness of 0.4 mm to 0.5 mm.

In an embodiment, the encapsulant 904 includes a thickness of 0.5 mm to 1.8 mm. In another embodiment, the encapsulant 904 includes a thickness of 0.5 mm to 1.7 mm. In another embodiment, the encapsulant 904 includes a thickness of 0.5 mm to 1.6 mm. In another embodiment, the encapsulant 904 includes a thickness of 0.5 mm to 1.5 mm. In another embodiment, the encapsulant 904 includes a thickness of 0.5 mm to 1.4 mm. In another embodiment, the encapsulant 904 includes a thickness of 0.5 mm to 1.3 mm. In another embodiment, the encapsulant 904 includes a thickness of 0.5 mm to 1.2 mm. In another embodiment, the encapsulant 904 includes a thickness of 0.5 mm to 1.1 mm. In another embodiment, the encapsulant 904 includes a thickness of 0.5 mm to 1.0 mm. In another embodiment, the encapsulant 904 includes a thickness of 0.5 mm to 0.9 mm. In another embodiment, the encapsulant 904 includes a thickness of 0.5 mm to 0.8 mm. In another embodiment, the encapsulant 904 includes a thickness of 0.5 mm to 0.7 mm. In another embodiment, the encapsulant 904 includes a thickness of 0.5 mm to 0.6 mm.

In an embodiment, the encapsulant 904 includes a thickness of 0.6 mm to 1.8 mm. In another embodiment, the encapsulant 904 includes a thickness of 0.6 mm to 1.7 mm. In another embodiment, the encapsulant 904 includes a thickness of 0.6 mm to 1.6 mm. In another embodiment, the encapsulant 904 includes a thickness of 0.6 mm to 1.5 mm. In another embodiment, the encapsulant 904 includes a thickness of 0.6 mm to 1.4 mm. In another embodiment, the encapsulant 904 includes a thickness of 0.6 mm to 1.3 mm. In another embodiment, the encapsulant 904 includes a thickness of 0.6 mm to 1.2 mm. In another embodiment, the encapsulant 904 includes a thickness of 0.6 mm to 1.1 mm. In another embodiment, the encapsulant 904 includes a thickness of 0.6 mm to 1.0 mm. In another embodiment, the encapsulant 904 includes a thickness of 0.6 mm to 0.9 mm. In another embodiment, the encapsulant 904 includes a thickness of 0.6 mm to 0.8 mm. In another embodiment, the encapsulant 904 includes a thickness of 0.6 mm to 0.7 mm.

In an embodiment, the encapsulant 904 includes a thickness of 0.7 mm to 1.8 mm. In another embodiment, the encapsulant 904 includes a thickness of 0.7 mm to 1.7 mm. In another embodiment, the encapsulant 904 includes a thickness of 0.7 mm to 1.6 mm. In another embodiment, the encapsulant 904 includes a thickness of 0.7 mm to 1.5 mm. In another embodiment, the encapsulant 904 includes a thickness of 0.7 mm to 1.4 mm. In another embodiment, the encapsulant 904 includes a thickness of 0.7 mm to 1.3 mm. In another embodiment, the encapsulant 904 includes a thickness of 0.7 mm to 1.2 mm. In another embodiment, the encapsulant 904 includes a thickness of 0.7 mm to 1.1 mm. In another embodiment, the encapsulant 904 includes a thickness of 0.7 mm to 1.0 mm. In another embodiment, the encapsulant 904 includes a thickness of 0.7 mm to 0.9 mm. In another embodiment, the encapsulant 904 includes a thickness of 0.7 mm to 0.8 mm.

In an embodiment, the encapsulant 904 includes a thickness of 0.8 mm to 1.8 mm. In another embodiment, the encapsulant 904 includes a thickness of 0.8 mm to 1.7 mm. In another embodiment, the encapsulant 904 includes a thickness of 0.8 mm to 1.6 mm. In another embodiment, the encapsulant 904 includes a thickness of 0.8 mm to 1.5 mm. In another embodiment, the encapsulant 904 includes a thickness of 0.8 mm to 1.4 mm. In another embodiment, the encapsulant 904 includes a thickness of 0.8 mm to 1.3 mm. In another embodiment, the encapsulant 904 includes a thickness of 0.8 mm to 1.2 mm. In another embodiment, the encapsulant 904 includes a thickness of 0.8 mm to 1.1 mm. In another embodiment, the encapsulant 904 includes a thickness of 0.8 mm to 1.0 mm. In another embodiment, the encapsulant 904 includes a thickness of 0.8 mm to 0.9 mm.

In an embodiment, the encapsulant 904 includes a thickness of 0.9 mm to 1.8 mm. In another embodiment, the encapsulant 904 includes a thickness of 0.9 mm to 1.7 mm. In another embodiment, the encapsulant 904 includes a thickness of 0.9 mm to 1.6 mm. In another embodiment, the encapsulant 904 includes a thickness of 0.9 mm to 1.5 mm. In another embodiment, the encapsulant 904 includes a thickness of 0.9 mm to 1.4 mm. In another embodiment, the encapsulant 904 includes a thickness of 0.9 mm to 1.3 mm. In another embodiment, the encapsulant 904 includes a thickness of 0.9 mm to 1.2 mm. In another embodiment, the encapsulant 904 includes a thickness of 0.9 mm to 1.1 mm. In another embodiment, the encapsulant 904 includes a thickness of 0.9 mm to 1.0 mm.

In an embodiment, the encapsulant 904 includes a thickness of 1.0 mm to 1.8 mm. In another embodiment, the encapsulant 904 includes a thickness of 1.0 mm to 1.7 mm. In another embodiment, the encapsulant 904 includes a thickness of 1.0 mm to 1.6 mm. In another embodiment, the encapsulant 904 includes a thickness of 1.0 mm to 1.5 mm. In another embodiment, the encapsulant 904 includes a thickness of 1.0 mm to 1.4 mm. In another embodiment, the encapsulant 904 includes a thickness of 1.0 mm to 1.3 mm. In another embodiment, the encapsulant 904 includes a thickness of 1.0 mm to 1.2 mm. In another embodiment, the encapsulant 904 includes a thickness of 1.0 mm to 1.1 mm.

In an embodiment, the encapsulant 904 includes a thickness of 1.1 mm to 1.8 mm. In another embodiment, the encapsulant 904 includes a thickness of 1.1 mm to 1.7 mm. In another embodiment, the encapsulant 904 includes a thickness of 1.1 mm to 1.6 mm. In another embodiment, the encapsulant 904 includes a thickness of 1.1 mm to 1.5 mm. In another embodiment, the encapsulant 904 includes a thickness of 1.1 mm to 1.4 mm. In another embodiment, the encapsulant 904 includes a thickness of 1.1 mm to 1.3 mm. In another embodiment, the encapsulant 904 includes a thickness of 1.1 mm to 1.2 mm.

In an embodiment, the encapsulant 904 includes a thickness of 1.2 mm to 1.8 mm. In another embodiment, the encapsulant 904 includes a thickness of 1.2 mm to 1.7 mm. In another embodiment, the encapsulant 904 includes a thickness of 1.2 mm to 1.6 mm. In another embodiment, the encapsulant 904 includes a thickness of 1.2 mm to 1.5 mm. In another embodiment, the encapsulant 904 includes a thickness of 1.2 mm to 1.4 mm. In another embodiment, the encapsulant 904 includes a thickness of 1.2 mm to 1.3 mm.

In an embodiment, the encapsulant 904 includes a thickness of 1.3 mm to 1.8 mm. In another embodiment, the encapsulant 904 includes a thickness of 1.3 mm to 1.7 mm. In another embodiment, the encapsulant 904 includes a thickness of 1.3 mm to 1.6 mm. In another embodiment, the encapsulant 904 includes a thickness of 1.3 mm to 1.5 mm. In another embodiment, the encapsulant 904 includes a thickness of 1.3 mm to 1.4 mm.

In an embodiment, the encapsulant 904 includes a thickness of 1.4 mm to 1.8 mm. In another embodiment, the encapsulant 904 includes a thickness of 1.4 mm to 1.7 mm. In another embodiment, the encapsulant 904 includes a thickness of 1.4 mm to 1.6 mm. In another embodiment, the encapsulant 904 includes a thickness of 1.4 mm to 1.5 mm.

In an embodiment, the encapsulant 904 includes a thickness of 1.5 mm to 1.8 mm. In another embodiment, the encapsulant 904 includes a thickness of 1.5 mm to 1.7 mm. In another embodiment, the encapsulant 904 includes a thickness of 1.5 mm to 1.6 mm. In an embodiment, the encapsulant 904 includes a thickness of 1.6 mm to 1.8 mm. In another embodiment, the encapsulant 904 includes a thickness of 1.6 mm to 1.7 mm. In an embodiment, the encapsulant 904 includes a thickness of 1.7 mm to 1.8 mm. In an embodiment, the encapsulant 904 includes a thickness of 0.4 mm. In an embodiment, the encapsulant 904 includes a thickness of 0.5 mm. In an embodiment, the encapsulant 904 includes a thickness of 0.6 mm. In an embodiment, the encapsulant 904 includes a thickness of 0.7 mm. In an embodiment, the encapsulant 904 includes a thickness of 0.8 mm. In an embodiment, the encapsulant 904 includes a thickness of 0.9 mm. In an embodiment, the encapsulant 904 includes a thickness of 1.0 mm. In an embodiment, the encapsulant 904 includes a thickness of 1.1 mm. In an embodiment, the encapsulant 904 includes a thickness of 1.2 mm. In an embodiment, the encapsulant 904 includes a thickness of 1.3 mm. In an embodiment, the encapsulant 904 includes a thickness of 1.4 mm. In an embodiment, the encapsulant 904 includes a thickness of 1.5 mm. In an embodiment, the encapsulant 904 includes a thickness of 1.6 mm. In an embodiment, the encapsulant 904 includes a thickness of 1.7 mm. In an embodiment, the encapsulant 904 includes a thickness of 1.8 mm.

In an embodiment, the first layer 904a of the encapsulant 904 includes a thickness of 0.2 mm to 0.9 mm. In another embodiment, the first layer 904a of the encapsulant 904 includes a thickness of 0.2 mm to 0.8 mm. In another embodiment, the first layer 904a of the encapsulant 904 includes a thickness of 0.2 mm to 0.7 mm. In another embodiment, the first layer 904a of the encapsulant 904 includes a thickness of 0.2 mm to 0.6 mm. In another embodiment, the first layer 904a of the encapsulant 904 includes a thickness of 0.2 mm to 0.5 mm. In another embodiment, the first layer 904a of the encapsulant 904 includes a thickness of 0.2 mm to 0.4 mm. In another embodiment, the first layer 904a of the encapsulant 904 includes a thickness of 0.2 mm to 0.3 mm.

In an embodiment, the first layer 904a of the encapsulant 904 includes a thickness of 0.3 mm to 0.9 mm. In another embodiment, the first layer 904a of the encapsulant 904 includes a thickness of 0.3 mm to 0.8 mm. In another embodiment, the first layer 904a of the encapsulant 904 includes a thickness of 0.3 mm to 0.7 mm. In another embodiment, the first layer 904a of the encapsulant 904 includes a thickness of 0.3 mm to 0.6 mm. In another embodiment, the first layer 904a of the encapsulant 904 includes a thickness of 0.3 mm to 0.5 mm. In another embodiment, the first layer 904a of the encapsulant 904 includes a thickness of 0.3 mm to 0.4 mm.

In an embodiment, the first layer 904a of the encapsulant 904 includes a thickness of 0.4 mm to 0.9 mm. In another embodiment, the first layer 904a of the encapsulant 904 includes a thickness of 0.4 mm to 0.8 mm. In another embodiment, the first layer 904a of the encapsulant 904 includes a thickness of 0.4 mm to 0.7 mm. In another embodiment, the first layer 904a of the encapsulant 904 includes a thickness of 0.4 mm to 0.6 mm. In another embodiment, the first layer 904a of the encapsulant 904 includes a thickness of 0.4 mm to 0.5 mm.

In an embodiment, the first layer 904a of the encapsulant 904 includes a thickness of 0.5 mm to 0.9 mm. In another embodiment, the first layer 904a of the encapsulant 904 includes a thickness of 0.5 mm to 0.8 mm. In another embodiment, the first layer 904a of the encapsulant 904 includes a thickness of 0.5 mm to 0.7 mm. In another embodiment, the first layer 904a of the encapsulant 904 includes a thickness of 0.5 mm to 0.6 mm. In an embodiment, the first layer 904a of the encapsulant 904 includes a thickness of 0.6 mm to 0.9 mm. In another embodiment, the first layer 904a of the encapsulant 904 includes a thickness of 0.6 mm to 0.8 mm. In another embodiment, the first layer 904a of the encapsulant 904 includes a thickness of 0.6 mm to 0.7 mm. In an embodiment, the first layer 904a of the encapsulant 904 includes a thickness of 0.7 mm to 0.9 mm. In another embodiment, the first layer 904a of the encapsulant 904 includes a thickness of 0.7 mm to 0.8 mm. In an embodiment, the first layer 904a of the encapsulant 904 includes a thickness of 0.8 mm to 0.9 mm.

In an embodiment, the second layer 904b of the encapsulant 904 includes a thickness of 0.2 mm to 0.9 mm. In another embodiment, the second layer 904b of the encapsulant 904 includes a thickness of 0.2 mm to 0.8 mm. In another embodiment, the second layer 904b of the encapsulant 904 includes a thickness of 0.2 mm to 0.7 mm. In another embodiment, the second layer 904b of the encapsulant 904 includes a thickness of 0.2 mm to 0.6 mm. In another embodiment, the second layer 904b of the encapsulant 904 includes a thickness of 0.2 mm to 0.5 mm. In another embodiment, the second layer 904b of the encapsulant 904 includes a thickness of 0.2 mm to 0.4 mm. In another embodiment, the second layer 904b of the encapsulant 904 includes a thickness of 0.2 mm to 0.3 mm.

In an embodiment, the second layer 904b of the encapsulant 904 includes a thickness of 0.3 mm to 0.9 mm. In another embodiment, the second layer 904b of the encapsulant 904 includes a thickness of 0.3 mm to 0.8 mm. In another embodiment, the second layer 904b of the encapsulant 904 includes a thickness of 0.3 mm to 0.7 mm. In another embodiment, the second layer 904b of the encapsulant 904 includes a thickness of 0.3 mm to 0.6 mm. In another embodiment, the second layer 904b of the encapsulant 904 includes a thickness of 0.3 mm to 0.5 mm. In another embodiment, the second layer 904b of the encapsulant 904 includes a thickness of 0.3 mm to 0.4 mm.

In an embodiment, the second layer 904b of the encapsulant 904 includes a thickness of 0.4 mm to 0.9 mm. In another embodiment, the second layer 904b of the encapsulant 904 includes a thickness of 0.4 mm to 0.8 mm. In another embodiment, the second layer 904b of the encapsulant 904 includes a thickness of 0.4 mm to 0.7 mm. In another embodiment, the second layer 904b of the encapsulant 904 includes a thickness of 0.4 mm to 0.6 mm. In another embodiment, the second layer 904b of the encapsulant 904 includes a thickness of 0.4 mm to 0.5 mm.

In an embodiment, the second layer 904b of the encapsulant 904 includes a thickness of 0.5 mm to 0.9 mm. In another embodiment, the second layer 904b of the encapsulant 904 includes a thickness of 0.5 mm to 0.8 mm. In another embodiment, the second layer 904b of the encapsulant 904 includes a thickness of 0.5 mm to 0.7 mm. In another embodiment, the second layer 904b of the encapsulant 904 includes a thickness of 0.5 mm to 0.6 mm. In an embodiment, the second layer 904b of the encapsulant 904 includes a thickness of 0.6 mm to 0.9 mm. In another embodiment, the second layer 904b of the encapsulant 904 includes a thickness of 0.6 mm to 0.8 mm. In another embodiment, the second layer 904b of the encapsulant 904 includes a thickness of 0.6 mm to 0.7 mm. In an embodiment, the second layer 904b of the encapsulant 904 includes a thickness of 0.7 mm to 0.9 mm. In another embodiment, the second layer 904b of the encapsulant 904 includes a thickness of 0.7 mm to 0.8 mm. In an embodiment, the second layer 904b of the encapsulant 904 includes a thickness of 0.8 mm to 0.9 mm.

In an embodiment, the thickness of the first layer 904a is equal to the thickness of the second layer 904b. In another embodiment, the thickness of the first layer 904a is different from the thickness of the second layer 904b.

In an embodiment, the frontsheet 906 includes a glass layer 908, a light scattering encapsulant layer 910 attached to a first surface of the glass layer 908, and a polymer layer 912 attached to a first surface of the light scattering encapsulant layer 910. In an embodiment, the frontsheet 906 is juxtaposed with the first layer 904a of the encapsulant 904. In an embodiment, each of the glass layer 908, the light scattering encapsulant layer 910, and the polymer layer 912 is transparent. In an embodiment, the polymer layer 912 is attached to the light scattering encapsulant layer 910 and the glass layer 908 by an adhesive layer 914. In an embodiment, the adhesive layer 914 may include polyvinyl butyrate, acrylic, silicone, or polycarbonate. In another embodiment, the adhesive layer 914 may include pressure sensitive adhesives. In another embodiment, the polymer layer 912 is attached to the light scattering encapsulant layer 910 and the glass layer 908 by thermal bonding. In another embodiment, the frontsheet 906 includes at least one of the glass layer 908 or the polymer layer 912.

In an embodiment, the glass layer 908 includes a thickness of 2.5 mm to 4 mm. In another embodiment, the glass layer 908 includes a thickness of 2.5 mm to 3.5 mm. In another embodiment, the glass layer 908 includes a thickness of 2.5 mm to 3 mm. In another embodiment, the glass layer 908 includes a thickness of 3 mm to 4 mm. In another embodiment, the glass layer 908 includes a thickness of 3.5 mm to 4 mm. In another embodiment, the glass layer 908 includes a thickness of 2.6 mm to 3.5 mm. In another embodiment, the glass layer 908 includes a thickness of 2.7 mm to 3.5 mm. In another embodiment, the glass layer 908 includes a thickness of 2.8 mm to 3.5 mm. In another embodiment, the glass layer 908 includes a thickness of 2.9 mm to 3.5 mm. In another embodiment, the glass layer 908 includes a thickness of 3 mm to 3.5 mm. In another embodiment, the glass layer 908 includes a thickness of 3.1 mm to 3.5 mm. In another embodiment, the glass layer 908 includes a thickness of 3.2 mm to 3.5 mm. In another embodiment, the glass layer 908 includes a thickness of 3.3 mm to 3.5 mm. In another embodiment, the glass layer 908 includes a thickness of 3.4 mm to 3.5 mm. In another embodiment, the glass layer 908 includes a thickness of 2.5 mm to 3.4 mm. In another embodiment, the glass layer 908 includes a thickness of 2.5 mm to 3.3 mm. In another embodiment, the glass layer 908 includes a thickness of 2.5 mm to 3.2 mm. In another embodiment, the glass layer 908 includes a thickness of 2.5 mm to 3.1 mm. In another embodiment, the glass layer 908 includes a thickness of 2.5 mm to 2.9 mm. In another embodiment, the glass layer 908 includes a thickness of 2.5 mm to 2.8 mm. In another embodiment, the glass layer 908 includes a thickness of 2.5 mm to 2.7 mm. In another embodiment, the glass layer 908 includes a thickness of 2.5 mm to 2.6 mm.

In another embodiment, the glass layer 908 includes a thickness of 2.5 mm. In another embodiment, the glass layer 908 includes a thickness of 2.6 mm. In another embodiment, the glass layer 908 includes a thickness of 2.7 mm. In another embodiment, the glass layer 908 includes a thickness of 2.8 mm. In another embodiment, the glass layer 908 includes a thickness of 2.9 mm. In another embodiment, the glass layer 908 includes a thickness of 3 mm. In another embodiment, the glass layer 908 includes a thickness of 3.1 mm. In another embodiment, the glass layer 908 includes a thickness of 3.2 mm. In another embodiment, the glass layer 908 includes a thickness of 3.3 mm. In another embodiment, the glass layer 908 includes a thickness of 3.4 mm. In another embodiment, the glass layer 908 includes a thickness of 3.5 mm. In another embodiment, the glass layer 908 includes a thickness of 3.6 mm. In another embodiment, the glass layer 908 includes a thickness of 3.7 mm. In another embodiment, the glass layer 908 includes a thickness of 3.8 mm. In another embodiment, the glass layer 908 includes a thickness of 3.9 mm. In another embodiment, the glass layer 908 includes a thickness of 4 mm.

In an embodiment, the adhesive layer 914 includes thermosetting polyolefin, thermosetting polyolefin encapsulant material, thermosetting ethylene-vinyl acetate (EVA), EVA encapsulants, thermoplastic olefin, thermoplastic polyolefin (TOP) or hybrids/combinations thereof.

In an embodiment, the adhesive layer 914 includes a thickness of 1 µm to 900 µm. In an embodiment, the adhesive layer 914 includes a thickness of 1 µm to 900 µm. In an embodiment, the adhesive layer 914 includes a thickness of 1 µm to 850 µm. In an embodiment, the adhesive layer 914 includes a thickness of 1 µm to 800 µm. In an embodiment, the adhesive layer 914 includes a thickness of 1 µm to 750 µm. In an embodiment, the adhesive layer 914 includes a thickness of 1 µm to 700 µm. In an embodiment, the adhesive layer 914 includes a thickness of 1 µm to 650 µm. In an embodiment, the adhesive layer 914 includes a thickness of 1 µm to 600 µm. In an embodiment, the adhesive layer 914 includes a thickness of 1 µm to 550 µm. In an embodiment, the adhesive layer 914 includes a thickness of 1 µm to 500 µm. In an embodiment, the adhesive layer 914 includes a thickness of 1 µm to 450 µm. In an embodiment, the adhesive layer 914 includes a thickness of 1 µm to 400 µm. In an embodiment, the adhesive layer 914 includes a thickness of 1 µm to 350 µm. In an embodiment, the adhesive layer 914 includes a thickness of 1 µm to 300 µm. In an embodiment, the adhesive layer 914 includes a thickness of 1 µm to 250 µm. In an embodiment, the adhesive layer 914 includes a thickness of 1 µm to 200 µm. In an embodiment, the adhesive layer 914 includes a thickness of 1 µm to 150 µm. In an embodiment, the adhesive layer 914 includes a thickness of 1 µm to 100 µm. In an embodiment, the adhesive layer 914 includes a thickness of 1 µm to 50 µm.

In an embodiment, the adhesive layer 914 includes a thickness of 50 µm to 900 µm. In an embodiment, the adhesive layer 914 includes a thickness of 50 µm to 850 µm. In an embodiment, the adhesive layer 914 includes a thickness of 50 µm to 800 µm. In an embodiment, the adhesive layer 914 includes a thickness of 50 µm to 750 µm. In an embodiment, the adhesive layer 914 includes a thickness of 50 µm to 700 µm. In an embodiment, the adhesive layer 914 includes a thickness of 50 µm to 650 µm. In an embodiment, the adhesive layer 914 includes a thickness of 50 µm to 600 µm. In an embodiment, the adhesive layer 914 includes a thickness of 50 µm to 550 µm. In an embodiment, the adhesive layer 914 includes a thickness of 50 µm to 500 µm. In an embodiment, the adhesive layer 914 includes a thickness of 50 µm to 450 µm. In an embodiment, the adhesive layer 914 includes a thickness of 50 µm to 400 µm. In an embodiment, the adhesive layer 914 includes a thickness of 50 µm to 350 µm. In an embodiment, the adhesive layer 914 includes a thickness of 50 µm to 300 µm. In an embodiment, the adhesive layer 914 includes a thickness of 50 µm to 250 µm. In an embodiment, the adhesive layer 914 includes a thickness of 50 µm to 200 µm. In an embodiment, the adhesive layer 914 includes a thickness of 50 µm to 150 µm. In an embodiment, the adhesive layer 914 includes a thickness of 50 µm to 100 µm.

In an embodiment, the adhesive layer 914 includes a thickness of 100 µm to 900 µm. In an embodiment, the adhesive layer 914 includes a thickness of 100 µm to 850 µm. In an embodiment, the adhesive layer 914 includes a thickness of 100 µm to 800 µm. In an embodiment, the adhesive layer 914 includes a thickness of 100 µm to 750 µm. In an embodiment, the adhesive layer 914 includes a thickness of 100 µm to 700 µm. In an embodiment, the adhesive layer 914 includes a thickness of 100 µm to 650 µm. In an embodiment, the adhesive layer 914 includes a thickness of 100 µm to 600 µm. In an embodiment, the adhesive layer 914 includes a thickness of 100 µm to 550 µm. In an embodiment, the adhesive layer 914 includes a thickness of 100 µm to 500 µm. In an embodiment, the adhesive layer 914 includes a thickness of 100 µm to 450 µm. In an embodiment, the adhesive layer 914 includes a thickness of 100 µm to 400 µm. In an embodiment, the adhesive layer 914 includes a thickness of 100 µm to 350 µm. In an embodiment, the adhesive layer 914 includes a thickness of 100 µm to 300 µm. In an embodiment, the adhesive layer 914 includes a thickness of 100 µm to 250 µm. In an embodiment, the adhesive layer 914 includes a thickness of 100 µm to 200 µm. In an embodiment, the adhesive layer 914 includes a thickness of 100 µm to 150 µm.

In an embodiment, the adhesive layer 914 includes a thickness of 150 µm to 900 µm. In an embodiment, the adhesive layer 914 includes a thickness of 150 µm to 850 µm. In an embodiment, the adhesive layer 914 includes a thickness of 150 µm to 800 µm. In an embodiment, the adhesive layer 914 includes a thickness of 150 µm to 750 µm. In an embodiment, the adhesive layer 914 includes a thickness of 150 µm to 700 µm. In an embodiment, the adhesive layer 914 includes a thickness of 150 µm to 650 µm. In an embodiment, the adhesive layer 914 includes a thickness of 150 µm to 600 µm. In an embodiment, the adhesive layer 914 includes a thickness of 150 µm to 550 µm. In an embodiment, the adhesive layer 914 includes a thickness of 150 µm to 500 µm. In an embodiment, the adhesive layer 914 includes a thickness of 150 µm to 450 µm. In an embodiment, the adhesive layer 914 includes a thickness of 150 µm to 400 µm. In an embodiment, the adhesive layer 914 includes a thickness of 150 µm to 350 µm. In an embodiment, the adhesive layer 914 includes a thickness of 150 µm to 300 µm. In an embodiment, the adhesive layer 914 includes a thickness of 150 µm to 250 µm. In an embodiment, the adhesive layer 914 includes a thickness of 150 µm to 200 µm.

In an embodiment, the adhesive layer 914 includes a thickness of 200 µm to 900 µm. In an embodiment, the adhesive layer 914 includes a thickness of 200 µm to 850 µm. In an embodiment, the adhesive layer 914 includes a thickness of 200 µm to 800 µm. In an embodiment, the adhesive layer 914 includes a thickness of 200 µm to 750 µm. In an embodiment, the adhesive layer 914 includes a thickness of 200 µm to 700 µm. In an embodiment, the adhesive layer 914 includes a thickness of 200 µm to 650 µm. In an embodiment, the adhesive layer 914 includes a thickness of 200 µm to 600 µm. In an embodiment, the adhesive layer 914 includes a thickness of 200 µm to 550 µm. In an embodiment, the adhesive layer 914 includes a thickness of 200 µm to 500 µm. In an embodiment, the adhesive layer 914 includes a thickness of 200 µm to 450 µm. In an embodiment, the adhesive layer 914 includes a thickness of 200 µm to 400 µm. In an embodiment, the adhesive layer 914 includes a thickness of 200 µm to 350 µm. In an embodiment, the adhesive layer 914 includes a thickness of 200 µm to 300 µm. In an embodiment, the adhesive layer 914 includes a thickness of 200 µm to 250 µm.

In an embodiment, the adhesive layer 914 includes a thickness of 250 µm to 900 µm. In an embodiment, the adhesive layer 914 includes a thickness of 250 µm to 850 µm. In an embodiment, the adhesive layer 914 includes a thickness of 250 µm to 800 µm. In an embodiment, the adhesive layer 914 includes a thickness of 250 µm to 750 µm. In an embodiment, the adhesive layer 914 includes a thickness of 250 µm to 700 µm. In an embodiment, the adhesive layer 914 includes a thickness of 250 µm to 650 µm. In an embodiment, the adhesive layer 914 includes a thickness of 250 µm to 600 µm. In an embodiment, the adhesive layer 914 includes a thickness of 250 µm to 550 µm. In an embodiment, the adhesive layer 914 includes a thickness of 250 µm to 500 µm. In an embodiment, the adhesive layer 914 includes a thickness of 250 µm to 450 µm. In an embodiment, the adhesive layer 914 includes a thickness of 250 µm to 400 µm. In an embodiment, the adhesive layer 914 includes a thickness of 250 µm to 350 µm. In an embodiment, the adhesive layer 914 includes a thickness of 250 µm to 300 µm.

In an embodiment, the adhesive layer 914 includes a thickness of 300 µm to 900 µm. In an embodiment, the adhesive layer 914 includes a thickness of 300 µm to 850 µm. In an embodiment, the adhesive layer 914 includes a thickness of 300 µm to 800 µm. In an embodiment, the adhesive layer 914 includes a thickness of 300 µm to 750 µm. In an embodiment, the adhesive layer 914 includes a thickness of 300 µm to 700 µm. In an embodiment, the adhesive layer 914 includes a thickness of 300 µm to 650 µm. In an embodiment, the adhesive layer 914 includes a thickness of 300 µm to 600 µm. In an embodiment, the adhesive layer 914 includes a thickness of 300 µm to 550 µm. In an embodiment, the adhesive layer 914 includes a thickness of 300 µm to 500 µm. In an embodiment, the adhesive layer 914 includes a thickness of 300 µm to 450 µm. In an embodiment, the adhesive layer 914 includes a thickness of 300 µm to 400 µm. In an embodiment, the adhesive layer 914 includes a thickness of 300 µm to 350 µm.

In an embodiment, the adhesive layer 914 includes a thickness of 350 µm to 900 µm. In an embodiment, the adhesive layer 914 includes a thickness of 350 µm to 850 µm. In an embodiment, the adhesive layer 914 includes a thickness of 350 µm to 800 µm. In an embodiment, the adhesive layer 914 includes a thickness of 350 µm to 750 µm. In an embodiment, the adhesive layer 914 includes a thickness of 350 µm to 700 µm. In an embodiment, the adhesive layer 914 includes a thickness of 350 µm to 650 µm. In an embodiment, the adhesive layer 914 includes a thickness of 350 µm to 600 µm. In an embodiment, the adhesive layer 914 includes a thickness of 350 µm to 550 µm. In an embodiment, the adhesive layer 914 includes a thickness of 350 µm to 500 µm. In an embodiment, the adhesive layer 914 includes a thickness of 350 µm to 450 µm. In an embodiment, the adhesive layer 914 includes a thickness of 350 µm to 400 µm.

In an embodiment, the adhesive layer 914 includes a thickness of 400 µm to 900 µm. In an embodiment, the adhesive layer 914 includes a thickness of 400 µm to 850 µm. In an embodiment, the adhesive layer 914 includes a thickness of 400 µm to 800 µm. In an embodiment, the adhesive layer 914 includes a thickness of 400 μm to 750 μm. In an embodiment, the adhesive layer 914 includes a thickness of 400 μm to 700 μm. In an embodiment, the adhesive layer 914 includes a thickness of 400 μm to 650 μm. In an embodiment, the adhesive layer 914 includes a thickness of 400 μm to 600 μm. In an embodiment, the adhesive layer 914 includes a thickness of 400 μm to 550 μm. In an embodiment, the adhesive layer 914 includes a thickness of 400 μm to 500 μm. In an embodiment, the adhesive layer 914 includes a thickness of 400 μm to 450 μm.

In an embodiment, the adhesive layer 914 includes a thickness of 450 μm to 900 μm. In an embodiment, the adhesive layer 914 includes a thickness of 450 μm to 850 μm. In an embodiment, the adhesive layer 914 includes a thickness of 450 μm to 800 μm. In an embodiment, the adhesive layer 914 includes a thickness of 450 μm to 750 μm. In an embodiment, the adhesive layer 914 includes a thickness of 450 μm to 700 μm. In an embodiment, the adhesive layer 914 includes a thickness of 450 μm to 650 μm. In an embodiment, the adhesive layer 914 includes a thickness of 450 μm to 600 μm. In an embodiment, the adhesive layer 914 includes a thickness of 450 μm to 550 μm. In an embodiment, the adhesive layer 914 includes a thickness of 450 μm to 500 μm.

In an embodiment, the adhesive layer 914 includes a thickness of 500 μm to 900 μm. In an embodiment, the adhesive layer 914 includes a thickness of 500 μm to 850 μm. In an embodiment, the adhesive layer 914 includes a thickness of 500 μm to 800 μm. In an embodiment, the adhesive layer 914 includes a thickness of 500 μm to 750 μm. In an embodiment, the adhesive layer 914 includes a thickness of 500 μm to 700 μm. In an embodiment, the adhesive layer 914 includes a thickness of 500 μm to 650 μm. In an embodiment, the adhesive layer 914 includes a thickness of 500 μm to 600 μm. In an embodiment, the adhesive layer 914 includes a thickness of 500 μm to 550 μm.

In an embodiment, the adhesive layer 914 includes a thickness of 550 μm to 900 μm. In an embodiment, the adhesive layer 914 includes a thickness of 550 μm to 850 μm. In an embodiment, the adhesive layer 914 includes a thickness of 550 μm to 800 μm. In an embodiment, the adhesive layer 914 includes a thickness of 550 μm to 750 μm. In an embodiment, the adhesive layer 914 includes a thickness of 550 μm to 700 μm. In an embodiment, the adhesive layer 914 includes a thickness of 550 μm to 650 μm. In an embodiment, the adhesive layer 914 includes a thickness of 550 μm to 600 μm.

In an embodiment, the adhesive layer 914 includes a thickness of 600 μm to 900 μm. In an embodiment, the adhesive layer 914 includes a thickness of 600 μm to 850 μm. In an embodiment, the adhesive layer 914 includes a thickness of 600 μm to 800 μm. In an embodiment, the adhesive layer 914 includes a thickness of 600 μm to 750 μm. In an embodiment, the adhesive layer 914 includes a thickness of 600 μm to 700 μm. In an embodiment, the adhesive layer 914 includes a thickness of 600 μm to 650 μm.

In an embodiment, the adhesive layer 914 includes a thickness of 650 μm to 900 μm. In an embodiment, the adhesive layer 914 includes a thickness of 650 μm to 850 μm. In an embodiment, the adhesive layer 914 includes a thickness of 650 μm to 800 μm. In an embodiment, the adhesive layer 914 includes a thickness of 650 μm to 750 μm. In an embodiment, the adhesive layer 914 includes a thickness of 650 μm to 700 μm. In an embodiment, the adhesive layer 914 includes a thickness of 700 μm to 900 μm. In an embodiment, the adhesive layer 914 includes a thickness of 700 μm to 850 μm. In an embodiment, the adhesive layer 914 includes a thickness of 700 μm to 800 μm. In an embodiment, the adhesive layer 914 includes a thickness of 700 μm to 750 μm. In an embodiment, the adhesive layer 914 includes a thickness of 750 μm to 900 μm. In an embodiment, the adhesive layer 914 includes a thickness of 750 μm to 850 μm. In an embodiment, the adhesive layer 914 includes a thickness of 750 μm to 800 μm. In an embodiment, the adhesive layer 914 includes a thickness of 800 μm to 900 μm. In an embodiment, the adhesive layer 914 includes a thickness of 800 μm to 850 μm. In an embodiment, the adhesive layer 914 includes a thickness of 850 μm to 900 μm.

In an embodiment, the adhesive layer 914 includes a thickness of 1 μm. In an embodiment, the adhesive layer 914 includes a thickness of 50 μm. In an embodiment, the adhesive layer 914 includes a thickness of 100 μm. In an embodiment, the adhesive layer 914 includes a thickness of 1 μm. In an embodiment, the adhesive layer 914 includes a thickness of 150 μm. In an embodiment, the adhesive layer 914 includes a thickness of 200 μm. In an embodiment, the adhesive layer 914 includes a thickness of 250 μm. In an embodiment, the adhesive layer 914 includes a thickness of 300 μm. In an embodiment, the adhesive layer 914 includes a thickness of 350 μm. In an embodiment, the adhesive layer 914 includes a thickness of 400 μm. In an embodiment, the adhesive layer 914 includes a thickness of 450 μm. In an embodiment, the adhesive layer 914 includes a thickness of 500 μm. In an embodiment, the adhesive layer 914 includes a thickness of 550 μm. In an embodiment, the adhesive layer 914 includes a thickness of 600 μm. In an embodiment, the adhesive layer 914 includes a thickness of 650 μm. In an embodiment, the adhesive layer 914 includes a thickness of 700 μm. In an embodiment, the adhesive layer 914 includes a thickness of 750 μm. In an embodiment, the adhesive layer 914 includes a thickness of 800 μm. In an embodiment, the adhesive layer 914 includes a thickness of 850 μm. In an embodiment, the adhesive layer 914 includes a thickness of 900 μm.

In an embodiment, the polymer layer 912 includes a fluoropolymer. In certain embodiments, the fluoropolymer may be ethylene tetrafluoroethylene (ETFE), fluoropolymer is polyvinylidene fluoride (PVDF), tetrafluoroethylene-hexafluoropropylene copolymers (FEP), and tetrafluoroethylene-hexafluoropropylene-vinylidene fluoride copolymers (THV), polyvinyl fluoride (PVF), or blends thereof. In an embodiment, the frontsheet includes fluoropolymers, acrylics, polyesters, silicones, polycarbonates, or combinations thereof. In other embodiments, the polymer layer 912 includes polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), or polyimide. In an embodiment, the polymer layer 912 includes a crosslinked polymeric material. In an embodiment, 50% to 99% of the polymer chains of the polymeric material are crosslinked.

In an embodiment, the polymer layer 912 includes a thickness of 0.01 mm to 0.5 mm. In another embodiment, the polymer layer 912 includes a thickness of 0.01 mm to 0.4 mm. In another embodiment, the polymer layer 912 includes a thickness of 0.01 mm to 0.3 mm. In another embodiment, the polymer layer 912 includes a thickness of 0.01 mm to 0.2 mm. In another embodiment, the polymer layer 912 includes a thickness of 0.01 mm to 0.1 mm. In another embodiment, the polymer layer 912 includes a thickness of 0.01 mm to 0.09 mm. In another embodiment, the polymer layer 912 includes a thickness of 0.01 mm to 0.08 mm. In another embodiment, the polymer layer 912 includes a thickness of 0.01 mm to 0.07 mm. In another embodiment, the polymer layer 912 includes a thickness of 0.01 mm to 0.06 mm. In another embodiment, the polymer layer 912 includes a thickness of 0.01 mm to 0.05 mm. In another embodiment, the polymer layer 912 includes a thickness of 0.01 mm to 0.04 mm. In another embodiment, the polymer layer 912 includes a thickness of 0.01 mm to 0.03 mm. In another embodiment, the polymer layer 912 includes a thickness of 0.01 mm to 0.02 mm.

In another embodiment, the polymer layer 912 includes a thickness of 0.01 mm to 0.4 mm. In another embodiment, the polymer layer 912 includes a thickness of 0.02 mm to 0.4 mm. In another embodiment, the polymer layer 912 includes a thickness of 0.03 mm to 0.4 mm. In another embodiment, the polymer layer 912 includes a thickness of 0.04 mm to 0.4 mm. In another embodiment, the polymer layer 912 includes a thickness of 0.05 mm to 0.4 mm. In another embodiment, the polymer layer 912 includes a thickness of 0.06 mm to 0.4 mm. In another embodiment, the polymer layer 912 includes a thickness of 0.07 mm to 0.4 mm. In another embodiment, the polymer layer 912 includes a thickness of 0.08 mm to 0.4 mm. In another embodiment, the polymer layer 912 includes a thickness of 0.09 mm to 0.4 mm. In another embodiment, the polymer layer 912 includes a thickness of 0.1 mm to 0.4 mm. In another embodiment, the polymer layer 912 includes a thickness of 0.15 mm to 0.4 mm. In another embodiment, the polymer layer 912 includes a thickness of 0.2 mm to 0.4 mm. In another embodiment, the polymer layer 912 includes a thickness of 0.25 mm to 0.4 mm. In another embodiment, the polymer layer 912 includes a thickness of 0.3 mm to 0.4 mm. In another embodiment, the polymer layer 912 includes a thickness of 0.35 mm to 0.4 mm.

In another embodiment, the polymer layer 912 includes a thickness of 0.025 mm to 0.1 mm. In another embodiment, the polymer layer 912 includes a thickness of 0.03 mm to 0.1 mm. In another embodiment, the polymer layer 912 includes a thickness of 0.035 mm to 0.1 mm. In another embodiment, the polymer layer 912 includes a thickness of 0.04 mm to 0.1 mm. In another embodiment, the polymer layer 912 includes a thickness of 0.045 mm to 0.1 mm. In another embodiment, the polymer layer 912 includes a thickness of 0.05 mm to 0.1 mm. In another embodiment, the polymer layer 912 includes a thickness of 0.06 mm to 0.1 mm. In another embodiment, the polymer layer 912 includes a thickness of 0.065 mm to 0.1 mm. In another embodiment, the polymer layer 912 includes a thickness of 0.07 mm to 0.1 mm. In another embodiment, the polymer layer 912 includes a thickness of 0.075 mm to 0.1 mm. In another embodiment, the polymer layer 912 includes a thickness of 0.08 mm to 0.1 mm. In another embodiment, the polymer layer 912 includes a thickness of 0.085 mm to 0.1 mm. In another embodiment, the polymer layer 912 includes a thickness of 0.09 mm to 0.1 mm. In another embodiment, the polymer layer 912 includes a thickness of 0.095 mm to 0.1 mm.

In an embodiment, the light scattering encapsulant layer 910 includes a thickness of 1 μm to 900 μm. In an embodiment, the light scattering encapsulant layer 910 includes a thickness of 1 μm to 900 μm. In an embodiment, the light scattering encapsulant layer 910 includes a thickness of 1 μm to 850 μm. In an embodiment, the light scattering encapsulant layer 910 includes a thickness of 1 μm to 800 μm. In an embodiment, the light scattering encapsulant layer 910 includes a thickness of 1 μm to 750 μm. In an embodiment, the light scattering encapsulant layer 910 includes a thickness of 1 μm to 700 μm. In an embodiment, the light scattering encapsulant layer 910 includes a thickness of 1 μm to 650 μm. In an embodiment, the light scattering encapsulant layer 910 includes a thickness of 1 μm to 600 μm. In an embodiment, the light scattering encapsulant layer 910 includes a thickness of 1 μm to 550 μm. In an embodiment, the light scattering encapsulant layer 910 includes a thickness of 1 μm to 500 μm. In an embodiment, the light scattering encapsulant layer 910 includes a thickness of 1 μm to 450 μm. In an embodiment, the light scattering encapsulant layer 910 includes a thickness of 1 μm to 400 μm. In an embodiment, the light scattering encapsulant layer 910 includes a thickness of 1 μm to 350 μm. In an embodiment, the light scattering encapsulant layer 910 includes a thickness of 1 μm to 300 μm. In an embodiment, the light scattering encapsulant layer 910 includes a thickness of 1 μm to 250 μm. In an embodiment, the light scattering encapsulant layer 910 includes a thickness of 1 μm to 200 μm. In an embodiment, the light scattering encapsulant layer 910 includes a thickness of 1 μm to 150 μm. In an embodiment, the light scattering encapsulant layer 910 includes a thickness of 1 μm to 100 μm. In an embodiment, the light scattering encapsulant layer 910 includes a thickness of 1 μm to 50 μm.

In an embodiment, the light scattering encapsulant layer 910 includes a thickness of 50 μm to 900 μm. In an embodiment, the light scattering encapsulant layer 910 includes a thickness of 50 μm to 850 μm. In an embodiment, the light scattering encapsulant layer 910 includes a thickness of 50 μm to 800 μm. In an embodiment, the light scattering encapsulant layer 910 includes a thickness of 50 μm to 750 μm. In an embodiment, the light scattering encapsulant layer 910 includes a thickness of 50 μm to 700 μm. In an embodiment, the light scattering encapsulant layer 910 includes a thickness of 50 μm to 650 μm. In an embodiment, the light scattering encapsulant layer 910 includes a thickness of 50 μm to 600 μm. In an embodiment, the light scattering encapsulant layer 910 includes a thickness of 50 μm to 550 μm. In an embodiment, the light scattering encapsulant layer 910 includes a thickness of 50 μm to 500 μm. In an embodiment, the light scattering encapsulant layer 910 includes a thickness of 50 μm to 450 μm. In an embodiment, the light scattering encapsulant layer 910 includes a thickness of 50 μm to 400 μm. In an embodiment, the light scattering encapsulant layer 910 includes a thickness of 50 μm to 350 μm. In an embodiment, the light scattering encapsulant layer 910 includes a thickness of 50 μm to 300 μm. In an embodiment, the light scattering encapsulant layer 910 includes a thickness of 50 μm to 250 μm. In an embodiment, the light scattering encapsulant layer 910 includes a thickness of 50 μm to 200 μm. In an embodiment, the light scattering encapsulant layer 910 includes a thickness of 50 μm to 150 μm. In an embodiment, the light scattering encapsulant layer 910 includes a thickness of 50 μm to 100 μm.

In an embodiment, the light scattering encapsulant layer 910 includes a thickness of 100 μm to 900 μm. In an embodiment, the light scattering encapsulant layer 910 includes a thickness of 100 μm to 850 μm. In an embodiment, the light scattering encapsulant layer 910 includes a thickness of 100 μm to 800 μm. In an embodiment, the light scattering encapsulant layer 910 includes a thickness of 100 μm to 750 μm. In an embodiment, the light scattering encapsulant layer 910 includes a thickness of 100 μm to 700 μm. In an embodiment, the light scattering encapsulant layer 910 includes a thickness of 100 µm to 650 µm. In an embodiment, the light scattering encapsulant layer 910 includes a thickness of 100 µm to 600 µm. In an embodiment, the light scattering encapsulant layer 910 includes a thickness of 100 µm to 550 µm. In an embodiment, the light scattering encapsulant layer 910 includes a thickness of 100 µm to 500 µm. In an embodiment, the light scattering encapsulant layer 910 includes a thickness of 100 µm to 450 µm. In an embodiment, the light scattering encapsulant layer 910 includes a thickness of 100 µm to 400 µm. In an embodiment, the light scattering encapsulant layer 910 includes a thickness of 100 µm to 350 µm. In an embodiment, the light scattering encapsulant layer 910 includes a thickness of 100 µm to 300 µm. In an embodiment, the light scattering encapsulant layer 910 includes a thickness of 100 µm to 250 µm. In an embodiment, the light scattering encapsulant layer 910 includes a thickness of 100 µm to 200 µm. In an embodiment, the light scattering encapsulant layer 910 includes a thickness of 100 µm to 150 µm.

In an embodiment, the light scattering encapsulant layer 910 includes a thickness of 150 µm to 900 µm. In an embodiment, the light scattering encapsulant layer 910 includes a thickness of 150 µm to 850 µm. In an embodiment, the light scattering encapsulant layer 910 includes a thickness of 150 µm to 800 µm. In an embodiment, the light scattering encapsulant layer 910 includes a thickness of 150 µm to 750 µm. In an embodiment, the light scattering encapsulant layer 910 includes a thickness of 150 µm to 700 µm. In an embodiment, the light scattering encapsulant layer 910 includes a thickness of 150 µm to 650 µm. In an embodiment, the light scattering encapsulant layer 910 includes a thickness of 150 µm to 600 µm. In an embodiment, the light scattering encapsulant layer 910 includes a thickness of 150 µm to 550 µm. In an embodiment, the light scattering encapsulant layer 910 includes a thickness of 150 µm to 500 µm. In an embodiment, the light scattering encapsulant layer 910 includes a thickness of 150 µm to 450 µm. In an embodiment, the light scattering encapsulant layer 910 includes a thickness of 150 µm to 400 µm. In an embodiment, the light scattering encapsulant layer 910 includes a thickness of 150 µm to 350 µm. In an embodiment, the light scattering encapsulant layer 910 includes a thickness of 150 µm to 300 µm. In an embodiment, the light scattering encapsulant layer 910 includes a thickness of 150 µm to 250 µm. In an embodiment, the light scattering encapsulant layer 910 includes a thickness of 150 µm to 200 µm.

In an embodiment, the light scattering encapsulant layer 910 includes a thickness of 200 µm to 900 µm. In an embodiment, the light scattering encapsulant layer 910 includes a thickness of 200 µm to 850 µm. In an embodiment, the light scattering encapsulant layer 910 includes a thickness of 200 µm to 800 µm. In an embodiment, the light scattering encapsulant layer 910 includes a thickness of 200 µm to 750 µm. In an embodiment, the light scattering encapsulant layer 910 includes a thickness of 200 µm to 700 µm. In an embodiment, the light scattering encapsulant layer 910 includes a thickness of 200 µm to 650 µm. In an embodiment, the light scattering encapsulant layer 910 includes a thickness of 200 µm to 600 µm. In an embodiment, the light scattering encapsulant layer 910 includes a thickness of 200 µm to 550 µm. In an embodiment, the light scattering encapsulant layer 910 includes a thickness of 200 µm to 500 µm. In an embodiment, the light scattering encapsulant layer 910 includes a thickness of 200 µm to 450 µm. In an embodiment, the light scattering encapsulant layer 910 includes a thickness of 200 µm to 400 µm. In an embodiment, the light scattering encapsulant layer 910 includes a thickness of 200 µm to 350 µm. In an embodiment, the light scattering encapsulant layer 910 includes a thickness of 200 µm to 300 µm. In an embodiment, the light scattering encapsulant layer 910 includes a thickness of 200 µm to 250 µm.

In an embodiment, the light scattering encapsulant layer 910 includes a thickness of 250 µm to 900 µm. In an embodiment, the light scattering encapsulant layer 910 includes a thickness of 250 µm to 850 µm. In an embodiment, the light scattering encapsulant layer 910 includes a thickness of 250 µm to 800 µm. In an embodiment, the light scattering encapsulant layer 910 includes a thickness of 250 µm to 750 µm. In an embodiment, the light scattering encapsulant layer 910 includes a thickness of 250 µm to 700 µm. In an embodiment, the light scattering encapsulant layer 910 includes a thickness of 250 µm to 650 µm. In an embodiment, the light scattering encapsulant layer 910 includes a thickness of 250 µm to 600 µm. In an embodiment, the light scattering encapsulant layer 910 includes a thickness of 250 µm to 550 µm. In an embodiment, the light scattering encapsulant layer 910 includes a thickness of 250 µm to 500 µm. In an embodiment, the light scattering encapsulant layer 910 includes a thickness of 250 µm to 450 µm. In an embodiment, the light scattering encapsulant layer 910 includes a thickness of 250 µm to 400 µm. In an embodiment, the light scattering encapsulant layer 910 includes a thickness of 250 µm to 350 µm. In an embodiment, the light scattering encapsulant layer 910 includes a thickness of 250 µm to 300 µm.

In an embodiment, the light scattering encapsulant layer 910 includes a thickness of 300 µm to 900 µm. In an embodiment, the light scattering encapsulant layer 910 includes a thickness of 300 µm to 850 µm. In an embodiment, the light scattering encapsulant layer 910 includes a thickness of 300 µm to 800 µm. In an embodiment, the light scattering encapsulant layer 910 includes a thickness of 300 µm to 750 µm. In an embodiment, the light scattering encapsulant layer 910 includes a thickness of 300 µm to 700 µm. In an embodiment, the light scattering encapsulant layer 910 includes a thickness of 300 µm to 650 µm. In an embodiment, the light scattering encapsulant layer 910 includes a thickness of 300 µm to 600 µm. In an embodiment, the light scattering encapsulant layer 910 includes a thickness of 300 µm to 550 µm. In an embodiment, the light scattering encapsulant layer 910 includes a thickness of 300 µm to 500 µm. In an embodiment, the light scattering encapsulant layer 910 includes a thickness of 300 µm to 450 µm. In an embodiment, the light scattering encapsulant layer 910 includes a thickness of 300 µm to 400 µm. In an embodiment, the light scattering encapsulant layer 910 includes a thickness of 300 µm to 350 µm.

In an embodiment, the light scattering encapsulant layer 910 includes a thickness of 350 µm to 900 µm. In an embodiment, the light scattering encapsulant layer 910 includes a thickness of 350 µm to 850 µm. In an embodiment, the light scattering encapsulant layer 910 includes a thickness of 350 µm to 800 µm. In an embodiment, the light scattering encapsulant layer 910 includes a thickness of 350 µm to 750 µm. In an embodiment, the light scattering encapsulant layer 910 includes a thickness of 350 µm to 700 µm. In an embodiment, the light scattering encapsulant layer 910 includes a thickness of 350 µm to 650 µm. In an embodiment, the light scattering encapsulant layer 910 includes a thickness of 350 µm to 600 µm. In an embodiment, the light scattering encapsulant layer 910 includes a thickness of 350 µm to 550 µm. In an embodiment, the light scattering encapsulant layer 910 includes a thickness of 350 µm to 500 µm. In an embodiment, the light scattering encapsulant layer 910 includes a thickness of 350 µm to 450 µm. In an embodiment, the light scattering encapsulant layer 910 includes a thickness of 350 m to 400 µm.

In an embodiment, the light scattering encapsulant layer 910 includes a thickness of 400 µm to 900 µm. In an embodiment, the light scattering encapsulant layer 910 includes a thickness of 400 µm to 850 µm. In an embodiment, the light scattering encapsulant layer 910 includes a thickness of 400 µm to 800 µm. In an embodiment, the light scattering encapsulant layer 910 includes a thickness of 400 µm to 750 µm. In an embodiment, the light scattering encapsulant layer 910 includes a thickness of 400 µm to 700 µm. In an embodiment, the light scattering encapsulant layer 910 includes a thickness of 400 µm to 650 µm. In an embodiment, the light scattering encapsulant layer 910 includes a thickness of 400 µm to 600 µm. In an embodiment, the light scattering encapsulant layer 910 includes a thickness of 400 µm to 550 µm. In an embodiment, the light scattering encapsulant layer 910 includes a thickness of 400 µm to 500 µm. In an embodiment, the light scattering encapsulant layer 910 includes a thickness of 400 µm to 450 µm.

In an embodiment, the light scattering encapsulant layer 910 includes a thickness of 450 µm to 900 µm. In an embodiment, the light scattering encapsulant layer 910 includes a thickness of 450 µm to 850 µm. In an embodiment, the light scattering encapsulant layer 910 includes a thickness of 450 µm to 800 µm. In an embodiment, the light scattering encapsulant layer 910 includes a thickness of 450 µm to 750 µm. In an embodiment, the light scattering encapsulant layer 910 includes a thickness of 450 µm to 700 µm. In an embodiment, the light scattering encapsulant layer 910 includes a thickness of 450 µm to 650 µm. In an embodiment, the light scattering encapsulant layer 910 includes a thickness of 450 µm to 600 µm. In an embodiment, the light scattering encapsulant layer 910 includes a thickness of 450 µm to 550 µm. In an embodiment, the light scattering encapsulant layer 910 includes a thickness of 450 µm to 500 µm.

In an embodiment, the light scattering encapsulant layer 910 includes a thickness of 500 µm to 900 µm. In an embodiment, the light scattering encapsulant layer 910 includes a thickness of 500 µm to 850 µm. In an embodiment, the light scattering encapsulant layer 910 includes a thickness of 500 µm to 800 µm. In an embodiment, the light scattering encapsulant layer 910 includes a thickness of 500 µm to 750 µm. In an embodiment, the light scattering encapsulant layer 910 includes a thickness of 500 µm to 700 µm. In an embodiment, the light scattering encapsulant layer 910 includes a thickness of 500 µm to 650 µm. In an embodiment, the light scattering encapsulant layer 910 includes a thickness of 500 µm to 600 µm. In an embodiment, the light scattering encapsulant layer 910 includes a thickness of 500 µm to 550 µm.

In an embodiment, the light scattering encapsulant layer 910 includes a thickness of 550 µm to 900 µm. In an embodiment, the light scattering encapsulant layer 910 includes a thickness of 550 µm to 850 µm. In an embodiment, the light scattering encapsulant layer 910 includes a thickness of 550 µm to 800 µm. In an embodiment, the light scattering encapsulant layer 910 includes a thickness of 550 µm to 750 µm. In an embodiment, the light scattering encapsulant layer 910 includes a thickness of 550 µm to 700 µm. In an embodiment, the light scattering encapsulant layer 910 includes a thickness of 550 µm to 650 µm. In an embodiment, the light scattering encapsulant layer 910 includes a thickness of 550 µm to 600 µm.

In an embodiment, the light scattering encapsulant layer 910 includes a thickness of 600 µm to 900 µm. In an embodiment, the light scattering encapsulant layer 910 includes a thickness of 600 µm to 850 µm. In an embodiment, the light scattering encapsulant layer 910 includes a thickness of 600 µm to 800 µm. In an embodiment, the light scattering encapsulant layer 910 includes a thickness of 600 µm to 750 µm. In an embodiment, the light scattering encapsulant layer 910 includes a thickness of 600 µm to 700 µm. In an embodiment, the light scattering encapsulant layer 910 includes a thickness of 600 µm to 650 µm.

In an embodiment, the light scattering encapsulant layer 910 includes a thickness of 650 µm to 900 µm. In an embodiment, the light scattering encapsulant layer 910 includes a thickness of 650 µm to 850 µm. In an embodiment, the light scattering encapsulant layer 910 includes a thickness of 650 µm to 800 µm. In an embodiment, the light scattering encapsulant layer 910 includes a thickness of 650 µm to 750 µm. In an embodiment, the light scattering encapsulant layer 910 includes a thickness of 650 µm to 700 µm. In an embodiment, the light scattering encapsulant layer 910 includes a thickness of 700 µm to 900 µm. In an embodiment, the light scattering encapsulant layer 910 includes a thickness of 700 µm to 850 µm. In an embodiment, the light scattering encapsulant layer 910 includes a thickness of 700 µm to 800 µm. In an embodiment, the light scattering encapsulant layer 910 includes a thickness of 700 µm to 750 µm. In an embodiment, the light scattering encapsulant layer 910 includes a thickness of 750 µm to 900 µm. In an embodiment, the light scattering encapsulant layer 910 includes a thickness of 750 µm to 850 µm. In an embodiment, the light scattering encapsulant layer 910 includes a thickness of 750 µm to 800 µm. In an embodiment, the light scattering encapsulant layer 910 includes a thickness of 800 µm to 900 µm. In an embodiment, the light scattering encapsulant layer 910 includes a thickness of 800 µm to 850 µm. In an embodiment, the light scattering encapsulant layer 910 includes a thickness of 850 µm to 900 µm.

In an embodiment, the light scattering encapsulant layer 910 includes a thickness of 1 µm. In an embodiment, the light scattering encapsulant layer 910 includes a thickness of 50 µm. In an embodiment, the light scattering encapsulant layer 910 includes a thickness of 100 µm. In an embodiment, the light scattering encapsulant layer 910 includes a thickness of 1 µm. In an embodiment, the light scattering encapsulant layer 910 includes a thickness of 150 µm. In an embodiment, the light scattering encapsulant layer 910 includes a thickness of 200 µm. In an embodiment, the light scattering encapsulant layer 910 includes a thickness of 250 µm. In an embodiment, the light scattering encapsulant layer 910 includes a thickness of 300 µm. In an embodiment, the light scattering encapsulant layer 910 includes a thickness of 350 µm. In an embodiment, the light scattering encapsulant layer 910 includes a thickness of 400 µm. In an embodiment, the light scattering encapsulant layer 910 includes a thickness of 450 µm. In an embodiment, the light scattering encapsulant layer 910 includes a thickness of 500 µm. In an embodiment, the light scattering encapsulant layer 910 includes a thickness of 550 µm. In an embodiment, the light scattering encapsulant layer 910 includes a thickness of 600 µm. In an embodiment, the light scattering encapsulant layer 910 includes a thickness of 650 µm. In an embodiment, the light scattering encapsulant layer 910 includes a thickness of 700 µm. In an embodiment, the light scattering encapsulant layer 910 includes a thickness of 750 μm. In an embodiment, the light scattering encapsulant layer 910 includes a thickness of 800 μm. In an embodiment, the light scattering encapsulant layer 910 includes a thickness of 850 μm. In an embodiment, the light scattering encapsulant layer 910 includes a thickness of 900 μm.

In an embodiment, the light scattering encapsulant layer 910 includes a structure similar to the upper encapsulant layer 220. In another embodiment, the light scattering encapsulant layer 910 includes a structure similar to the encapsulant 440. In an embodiment, the light scattering encapsulant layer 910 includes a structure similar to the upper encapsulant layer 220. In another embodiment, the light scattering encapsulant layer 910 includes a structure similar to the encapsulant 550. In another embodiment, the light scattering encapsulant layer 910 includes a structure similar to the encapsulant 650. In another embodiment, the light scattering encapsulant layer 910 includes a structure similar to the encapsulant 740.

In an embodiment, a backsheet 916 is juxtaposed with the second layer 904b of the encapsulant 904. In an embodiment, the backsheet 916 includes thermoplastic polyolefin (TPO). In an embodiment, the backsheet 916 includes a single ply TPO roofing membrane. In other embodiments, non-limiting examples of TPO membranes are disclosed in U.S. Pat. No. 9,359,014 to Yang et al., which is incorporated by reference herein in its entirety. In another embodiment, the backsheet 916 includes polyvinyl chloride. In an embodiment, the backsheet 916 includes ethylene propylene diene monomer (EPDM) rubber. In an embodiment, the backsheet 916 includes a flame retardant additive. In some embodiments, the flame retardant additive may be clays, nanoclays, silicas, carbon black, metal hydroxides such as aluminum hydroxide, metal foils, graphite, and combinations thereof.

While a number of embodiments of the present invention have been described, it is understood that these embodiments are illustrative only, and not restrictive, and that many modifications may become apparent to those of ordinary skill in the art. Further still, the various steps may be carried out in any desired order (and any desired steps may be added and/or any desired steps may be eliminated).

What is claimed is:

1. A system, comprising:
    a roof deck,
    at least one photovoltaic module on the roof deck,
        wherein each of the at least one photovoltaic module includes:
            a superstrate layer having an upper surface and a lower surface opposite the upper surface,
            an encapsulant having an upper layer and a lower layer opposite the upper layer,
            wherein the upper layer is juxtaposed with the lower surface of the superstrate layer; and
                a photovoltaic layer between the upper layer and the lower layer of the encapsulant,
                wherein the upper layer of the encapsulant is positioned above the photovoltaic layer,
                wherein the photovoltaic layer includes a first solar cell, a second solar cell, and a third solar cell,
                wherein the second solar cell is adjacent to the first solar cell,
                wherein the third solar cell is adjacent to the second solar cell;
            light-scattering material within the upper layer of the encapsulant,
            wherein the light-scattering material above the first and third solar cells has a first light-scattering value as measured in accordance with an ASTM E430 standard,
            wherein the light-scattering material above the second solar cell has a second light scattering value as measured in accordance with the ASTM E430 standard, and
            wherein the second light-scattering value is different than the first light-scattering value.

2. The system of claim 1, wherein the first light scattering value is 0.1 to 12 haze units.

3. The system of claim 1, wherein the second light scattering value is 0.1 to 12 haze units.

4. The system of claim 1, wherein the upper layer of the encapsulant includes a polymeric material.

5. The system of claim 4, wherein the polymeric material includes at least one of ethylene-co-vinyl acetate, polydimethyl siloxane, a polyolefin elastomer, or a combination thereof.

6. The system of claim 1, wherein the superstrate layer includes a glass material.

7. The system of claim 1, wherein the superstrate layer includes a polymeric material.

8. The system of claim 1, wherein the superstrate layer is optically transparent.

9. The system of claim 1, wherein at least a portion of the upper layer of the encapsulant includes a pattern.

10. The system of claim 9, wherein the pattern includes at least one of squares, rectangles, lozenges, diamonds, rhombuses, parallelograms, circles, hexagons, triangles, or a combination thereof.

11. The system of claim 1, wherein a transmission loss of power of light transmitted through the upper layer of the encapsulant having the light-scattering material above the second solar cell is less than 2 percent as compared to light transmitted through a comparison upper encapsulant layer that is identical to the upper layer of the encapsulant but lacks the light-scattering material.

12. The system of claim 1, wherein the at least one photovoltaic module includes a first photovoltaic module and a second photovoltaic module, wherein the second photovoltaic module is adjacent to the first photovoltaic module, and wherein the second light-scattering value of the first photovoltaic module is different from the second light-scattering value of the second photovoltaic module.

13. The system of claim 12, wherein the difference between the second light-scattering value of the upper layer of the encapsulant of the first photovoltaic module and the second light-scattering value of the upper layer of the encapsulant of the second photovoltaic module imparts a random appearance to the system.

14. A system, comprising:
    a roof deck; and
    a plurality of photovoltaic modules installed on the roof deck,
        wherein each of the photovoltaic modules includes
            a superstrate layer having an upper surface and a lower surface opposite the upper surface, and
            an encapsulant having an upper layer and a lower layer opposite the upper layer, wherein the upper layer is juxtaposed with the lower surface of the superstrate layer, and
            a photovoltaic layer;
            wherein the upper layer of the encapsulant is positioned above the photovoltaic layer, wherein the photovoltaic layer includes a first solar cell, a second solar cell, and a third solar cell wherein the second solar cell is adjacent to the first solar cell, wherein the third solar cell is adjacent to the second solar cell; light-scattering material within the upper layer of the encapsulant, wherein the light-scattering material above the first and third solar cells has a first light-scattering value as measured in accordance with an ASTM E430 standard, wherein the light-scattering material above the second solar cell has a second light-scattering value as measured in accordance with the ASTM E430 standard, and wherein the second light scattering value is different than the first light scattering value.

15. The system of claim 14, wherein each of the plurality of photovoltaic modules includes a photovoltaic layer intermediate the upper layer of the encapsulant and the lower layer of the encapsulant, wherein at least a first one of the photovoltaic modules is electrically active, and wherein at least a second one of the photovoltaic modules is electrically inactive.

16. The system of claim 15, wherein the second one of the photovoltaic modules meets standards of California Building Energy Efficiency Standards of Residential and Non-residential Buildings, Title 24, Part 6.

17. The system of claim 16, wherein the second one of the photovoltaic modules has a solar reflectivity index (SRI) greater than 16.

18. The system of claim 1, wherein the photovoltaic layer includes a fourth solar cell, wherein the fourth solar cell is adjacent the third solar cell, wherein the light-scattering material above the fourth solar cell has a third light scattering value as measured in accordance with the ASTM E430 standard, and wherein the third light scattering value is different than at least one of the first light scattering value and the second light scattering value.

19. The system of claim 14, wherein the photovoltaic layer includes a fourth solar cell, wherein the fourth solar cell is adjacent the third solar cell, wherein the light-scattering material above the fourth solar cell has a third light scattering value as measured in accordance with the ASTM E430 standard, and wherein the third light scattering value is different than at least one of the first light scattering value and the second light scattering value.

20. A system, comprising:

a roof deck; and a plurality of photovoltaic modules installed on the roof deck, wherein at least two of the plurality of photovoltaic modules includes a superstrate layer having an upper surface and a lower surface opposite the upper surface, and an encapsulant having an upper layer and a lower layer opposite the upper layer, wherein the upper layer is juxtaposed with the lower surface of the superstrate layer, wherein the upper layer extends within a first plane, a photovoltaic layer, wherein the upper layer of the encapsulant is positioned above the photovoltaic layer, and light-scattering material within the upper layer of the encapsulant, wherein the light-scattering material in the first plane of the upper layer of the encapsulant includes multiple and varying light-scattering values, and wherein the light-scattering values are measured in accordance with an ASTM E430 standard.

* * * * *